(12) United States Patent
Rendon Hernandez et al.

(10) Patent No.: US 12,699,116 B2
(45) Date of Patent: Aug. 4, 2026

(54) REDUCED-CROSSTALK, INTEGRATED LOW-PROFILE CURRENT SENSOR PCB MODULE

(71) Applicant: Schneider Electric USA, Inc., Andover, MA (US)

(72) Inventors: Adrian Abdala Rendon Hernandez, Tiffin, IA (US); Juan Ignacio Melecio Ramirez, North Liberty, IA (US); Collin Richard Fischels, Independence, IA (US)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 242 days.

(21) Appl. No.: 18/526,390

(22) Filed: Dec. 1, 2023

(65) Prior Publication Data

US 2024/0329090 A1 Oct. 3, 2024

Related U.S. Application Data

(63) Continuation-in-part of application No. 18/367,256, filed on Sep. 12, 2023, now Pat. No. 12,571,818.

(60) Provisional application No. 63/529,544, filed on Jul. 28, 2023, provisional application No. 63/456,427, filed on Mar. 31, 2023.

(51) Int. Cl.
| | |
|---|---|
| *G01R 19/25* | (2006.01) |
| *G01R 15/18* | (2006.01) |
| *H05K 1/02* | (2006.01) |
| *H05K 1/11* | (2006.01) |
| *G01R 31/52* | (2020.01) |

(52) U.S. Cl.
CPC ....... *G01R 15/181* (2013.01); *G01R 19/2513* (2013.01); *H05K 1/0216* (2013.01); *H05K 1/116* (2013.01); *G01R 31/52* (2020.01); *H05K 2201/09227* (2013.01); *H05K 2201/09236* (2013.01); *H05K 2201/10151* (2013.01)

(58) Field of Classification Search
CPC .. G01R 15/181; G01R 19/2513; G01R 31/52; G01R 22/10; H05K 1/0216; H05K 1/116
See application file for complete search history.

(56) References Cited

U.S. PATENT DOCUMENTS

| | | | | |
|---|---|---|---|---|
| 6,414,475 B1 * | 7/2002 | Dames | ................... | G01R 15/18 |
| | | | | 324/142 |
| 7,365,535 B2 * | 4/2008 | Muniraju | ............. | G01R 15/207 |
| | | | | 324/225 |

(Continued)

*Primary Examiner* — Dominic E Hawkins
(74) *Attorney, Agent, or Firm* — Quinn IP Law

(57) ABSTRACT

A system and method are provided for energy monitoring. The system and method include a trace current sensor formed on a first printed circuit board (PCB) substrate around at an opening of the first PCB substrate. The opening is configured to receive a portion of an electrical conductor to be monitored by the sensor. The system and method also include a signal conditioner for conditioning an output signal from the sensor. The output signal corresponds to a measurement of current on the conductor. The system and method can further include a processor(s) for measuring energy usage of load(s) connected to the conductor based on the current measurement. The signal conditioner and/or the processor(s) are either on the first PCB substrate or on a separate second PCB substrate which is connected to the first PCB substrate across a flexible connector.

20 Claims, 30 Drawing Sheets

(56)         References Cited

U.S. PATENT DOCUMENTS

| | | | | |
|---|---|---|---|---|
| 11,205,927 | B2 * | 12/2021 | Ellis ........................ | H02J 50/10 |
| 2014/0167786 | A1 * | 6/2014 | Gutierrez ............. | G01R 15/181 |
| | | | | 324/654 |
| 2015/0331020 | A1 * | 11/2015 | Gilbert ................... | G01R 19/28 |
| | | | | 324/127 |
| 2016/0202304 | A1 * | 7/2016 | Beierschmitt ............ | H02H 3/16 |
| | | | | 324/750.01 |
| 2017/0169979 | A1 * | 6/2017 | Mittelstadt ........... | H01H 83/144 |
| 2022/0192549 | A1 * | 6/2022 | Khan ..................... | H10K 65/00 |
| 2024/0069088 | A1 * | 2/2024 | Leizerovich ......... | G01R 31/085 |

* cited by examiner

Current sensor/energy measurement PCB module (150, 150B)

120

930

910

920

PCB trace current sensor (125B)

126

120

930

920    910

I/O connector to sensor section of main PCBA

PCB trace current sensor (125B)

100

Current sensor/energy
measurement PCB module
(150, 150B)

Current sensor/energy
measurement PCB module
(150, 150B)

100

Signal
conditioner
(120)

I/O connector to
sensor section of
main PCBA

Main
conductors
(L2, N, L1)

PCB trace
sensors
(125A, 125B)

126

Current sensor/energy measurement PCB module (151, 151B)

120

1230

1210

PCB trace sensors (127A, 127B)

1220

127

1220

120

1230

I/O connector to sensor section of main PCBA

1210

PCB trace sensors (127A, 127B)

100

Current sensor/energy measurement PCB module (151, 151B)

Current sensor/energy measurement PCB module (151, 151B)

100

Signal conditioner (120)

126

I/O connector to sensor section of main PCBA

Main conductors (L2, N, L1)

PCB trace sensors (127A, 127B)

Energy Monitoring Sub-System
1700A

PCB Trace
Sensor (125C)

Flexible Connector
(128)

Signal Chain and Energy
Monitoring Board (1750A)

Integrator

Energy
IC

Arc
Det

Connector for Comms.,
Power, Voltage and
Current

Power
supply

C

IN

Measured Line Voltage,
and Power Supply Voltage

OUT

Measured Line Current,
and Arc Data

Energy Monitoring Sub-System
1900

Current
Path/Main
Conductor
(e.g., Line 1)

PCB Trace Sensor (125C)

Flexible
Connector
(128)

Signal chain and
energy monitoring
board (1950)

Energy Monitoring Sub-System
2000A

Energy Monitoring Sub-System
2000B

2100

PCB trace
sensor
(125C)

Conductor
(e.g., L1)

Second
PCB (2150)

Flexible
Connector (128)

2100

PCB trace
sensor
(125C)

Conductor
(e.g., L1)

Second
PCB (2150)

Flexible
Connector (128)

2100

PCB trace sensor (125C)

Conductor (e.g., L1)

Flexible Connector (128)

Second PCB (2150)

REDUCED-CROSSTALK, INTEGRATED LOW-PROFILE CURRENT SENSOR PCB MODULE

The present application claims the benefit of and priority to U.S. Non-Provisional application Ser. No. 18/367,256, filed Sep. 12, 2023, entitled PCB TRACE CURRENT SENSOR FOR ENERGY MEASUREMENT; U.S. Provisional Patent Application Ser. No. 63/456,427, filed Mar. 31, 2023, entitled PCB TRACE CURRENT SENSOR FOR ENERGY MEASUREMENT; and U.S. Provisional Patent Application Ser. No. 63/529,544, filed Jul. 28, 2023, entitled REDUCED-CROSSTALK, INTEGRATED LOW-PRO-FILE CURRENT SENSOR PCB MODULE. The disclosures of the above-identified prior U.S. patent applications, in their entirety, are considered as being part of the present application, and thus, are incorporated herein by reference in their entirety.

TECHNICAL FIELD

The present disclosure relates to circuit breakers, metering devices, wiring devices, and other devices that monitor and measure current flow, and more particularly to systems and methods for sensing current in such devices using a PCB module with trace current sensor(s), associated signal conditioner(s) and embedded connector(s) on a PCB substrate.

BACKGROUND

Modern protection devices (e.g., circuit breakers), metering devices, wiring devices, and other current flow monitoring devices that monitor and measure current flow and energy usage may have components that enable several functions not previously available in prior devices. For example, a CPU (e.g., microcontroller or MCU) in an electronic circuit breaker can allow the breaker to function as both a ground fault circuit interrupt (GFCI) device as well as an arc fault circuit interrupt (AFCI) device. The CPU can detect such faults by constantly sensing and sampling line current and monitoring these currents.

In many electronic circuit breakers and other current flow monitoring device(s) (also referred herein as "flow monitoring device(s)"), the current sensor is a current transformer that has a large number of wire coils, or windings, wrapped around a toroidal core, usually ferromagnetic material alloys. The current transformer may be optimized by adjusting the number of windings (turns), by using a ferrite core, and the like. Some circuit breakers use a so-called "coreless" current sensor, also known as a "current rate of change" or "di/dt" sensor, a "current rise time" sensor, or a Rogowski coil, where the toroidal core is non-ferromagnetic. The Rogowski coil type current sensor provides an output signal, which is a voltage that is proportional to the rate of change of the input signal, which is the line current.

However, the use of conventional current transformers as current sensors can present several design challenges. For one thing, these current transformers tend to be bulky and occupy a lot of space, making them difficult to incorporate into an already crowded electronic circuit breaker. This is especially true for miniature circuit breakers (MCB) where internal spacing is even more constrained. Additional challenges also arise due to the increased mechanical complexity that typically accompanies installation of such conventional current transformers within a circuit breaker, wiring device, metering device, or other current flow monitoring device.

Furthermore, a current flow monitoring device may need to satisfy certain standard requirements. For example, an accuracy class of electricity meter refers to the class of measuring instruments that meet certain measurement standard requirements and keep measurement error within the specified limit. Anomalies in measuring can cost hundreds of thousands of dollars in errors over time. The accuracy of an energy meter or other flow monitoring device can be determined by a number of parameters, including network load, power factor of the system, and accuracy of the meter itself and its components (e.g., current sensor and signal conditioner), as well as the influence of an interfering field generated by an electromagnetic source located outside of the current sensor. The measurement error inflicted by a current in parallel or proximity to the current of interest is often referred to as crosstalk or crosstalk error. Traditional current sensors, which are commonly used in flow monitoring devices, have lead wires (e.g., fly wires) that are sensitive to interference, resulting in a loss of practical accuracy.

Accordingly, a need exists for a way to improve, among other things, the operational accuracy of current flow monitoring devices (including the reduction of interference such as crosstalk and errors associated therewith) and to improve the ability to more easily assemble and test current flow monitoring devices and their components.

SUMMARY

Embodiments of the present disclosure relate to systems and methods for using integrated Printed Circuit Board (PCB) module with PCB trace current sensor(s) within protection devices, wiring devices, metering devices, and other devices that monitor and measure current flow and energy usage/consumption.

In accordance with one or more embodiments, an energy monitoring system includes at least one trace current sensor formed on a first printed circuit board (PCB) substrate around at least one opening of the first PCB substrate. The at least one opening is configured to receive a portion of an electrical conductor to be monitored by the at least one trace current sensor. The energy monitoring system further includes at least one signal conditioner for conditioning an output signal from the at least one trace current sensor. The output signal corresponds to a measurement of current on the conductor. The at least one signal conditioner is either on the first PCB substrate or a separate second PCB substrate that is connected to the first PCB substrate across a flexible connector.

In various embodiments, the at least one signal conditioner is on the first PCB substrate. The energy monitoring system can further include a processor(s), on the first PCB substrate, for measuring energy usage of one or more loads connected to the conductor based on the measurement of current.

In various embodiments, the at least one opening can comprise a plurality of sensor openings each configured to receive an electrical conductor to be monitored. Each of the sensor openings can have associated therewith a trace current sensor of the at least one trace current sensor and a signal conditioner of the at least one signal conditioner on the first PCB substrate.

In various embodiments, the at least one trace current sensor can comprise: a plurality of electrically conductive elongate traces on the first PCB substrate extending radially outward from the central opening, the traces arranged in pairs of traces, the traces in each pair of traces being formed on opposite sides of the first PCB substrate; a plurality of vertical interconnect access (vias) on the first PCB substrate, the vias connecting the traces together so as to form a conductive helix in the shape of a circle or a polygon that surrounds the central opening in the first PCB substrate that resembles a Rogowski coil; and lead terminals on the first PCB substrate, the lead terminals being formed by omitting a via for a given pair of traces and terminating the traces for the given pair of traces.

In various embodiments, each of the sensor openings can be a notch on a side of the first PCB substrate.

In various embodiments, each of the sensor openings can be a through-hole within a border of a body of the PCB substrate.

In various embodiments, the at least one signal conditioner can include at least a signal integrator.

In various embodiments, each trace current sensor can be connected to a respective signal conditioner via embedded conductor(s) on the first PCB substrate.

In various embodiments, the energy monitoring system can further include at least one non-sensor opening configured to allow an electrical conductor to pass through the first PCB substrate.

In various embodiments, the plurality of sensor openings can comprise two sensor openings for monitoring first and second power line conductors, and the at least one non-sensor opening is configured to receive a neutral conductor.

In various embodiments, the output signal from the at least one trace current sensor can be a voltage signal corresponding to a measurement of current on the conductor.

In accordance with a further embodiment, the at least one signal conditioner can be on the second PCB substrate, and the first PCB substrate and the second PCB substrate or components thereof can be connected across the flexible connector. The flexible connector can be a flat flexible connector or FFC. The energy monitoring system can further include a processor(s), on the second PCB substrate, for measuring energy usage of one or more loads connected to the conductor based on the measurement of current. In various embodiments, the processor(s) can further be configured to perform arc fault detection based on the measurement of current. In various embodiments, the at least one signal conditioner can be at least a signal integrator.

In accordance with yet another embodiment, a flow monitoring device can include a device processor(s); and the energy monitoring system as described above. The flow monitoring device can comprise of one of a miniature circuit breaker (MCB), a metering device, an energy metering device, a wiring device, an arc fault circuit interrupt (AFCI) device, a ground fault interrupt (GFI) receptacle wiring device, or a GFI smart plug.

In accordance with a further embodiment, a flow monitoring device can include the energy monitoring system as described above. The energy monitoring device can include a processor(s), on the second PCB substrate, for measuring energy usage of one or more loads connected to the conductor based on the measurement of current. The flow monitoring device further includes a device processor(s) configured to: receive from the energy monitoring system real-time measurement of energy usage of one or more loads connected to the conductor, and manage energy usage through the conductor based on the measurement of energy usage.

In various embodiments, the flow monitoring device can comprise a multi-pole miniature circuit breaker having N-poles associated with N line conductors where N is a positive integer greater than 1. The flow monitoring device can include a number N of the energy monitoring system each of which monitors a respective conductor of the N line conductors. Each energy monitoring system can have a single trace current sensor.

In accordance with various embodiments, an integrated current sensor or energy measurement PCB module is provided as shown and described herein.

In accordance with an embodiment, there is provided a method of providing an integrated current sensor or energy measurement PCB module for a flow monitoring device substantially as shown and described herein.

In some embodiments, the systems and methods can provide a Rogowski coil type current sensor in which the coil windings are formed by electrically conductive traces on a printed circuit board (PCB) substrate. More specifically, each coil winding is composed of a pair of elongate traces formed on opposite sides of a PCB substrate and extending radially outward from a central opening or hole in the PCB substrate. Each trace in the pair of traces is connected to electrically conductive vias (vertical interconnect access), one via at each end of the trace. The via at one end connects the trace to its opposite trace in the pair of traces, while the via at the other end connects the trace to an opposite trace in an adjacent pair of traces. To facilitate the latter connection, the opposite trace in each pair of traces may run at an angle, or have a segment that angles, toward the opposite trace in an adjacent pair of traces. The result is a conductive helix in the shape of a circle or a polygon that surrounds the central opening in the PCB substrate that resembles a Rogowski coil. Lead terminals for the PCB trace current sensor may then be formed by omitting the via at one end of any given pair of traces and connecting circuit leads to the open-ended traces.

In some embodiments, alternating pairs of traces on the PCB substrate may have a different overall length in order to avoid overcrowding of the traces near the central opening as a result of the radially outward direction of the traces.

In some embodiments, a signal conditioning circuit may be provided on the PCB substrate for convenient conditioning and processing of the voltage signals output by the PCB trace current sensor.

The above PCB trace current sensor provides several advantages over current sensors that are based on conventional current transformers. For example, the PCB trace current sensor as a reduced volume, small footprint, low profile, simple hardware architecture, installs more easily into current flow monitoring devices (e.g., circuit breakers, metering devices, or wiring devices), and is relatively inexpensive to manufacture compared to current sensors that are based on conventional current transformers.

The above PCB trace current sensor also provides galvanic isolated monitoring of electrical current, accurate manufacturing reproducibility, and low production cost. The PCB trace current sensor also has the advantage of not containing any ferromagnetic material. This means the PCB trace current sensor does not experience magnetic saturation, resulting in a significantly larger bandwidth than conventional current transformers, thereby allowing for measurement of higher currents with the PCB trace current sensor.

Figure 1:
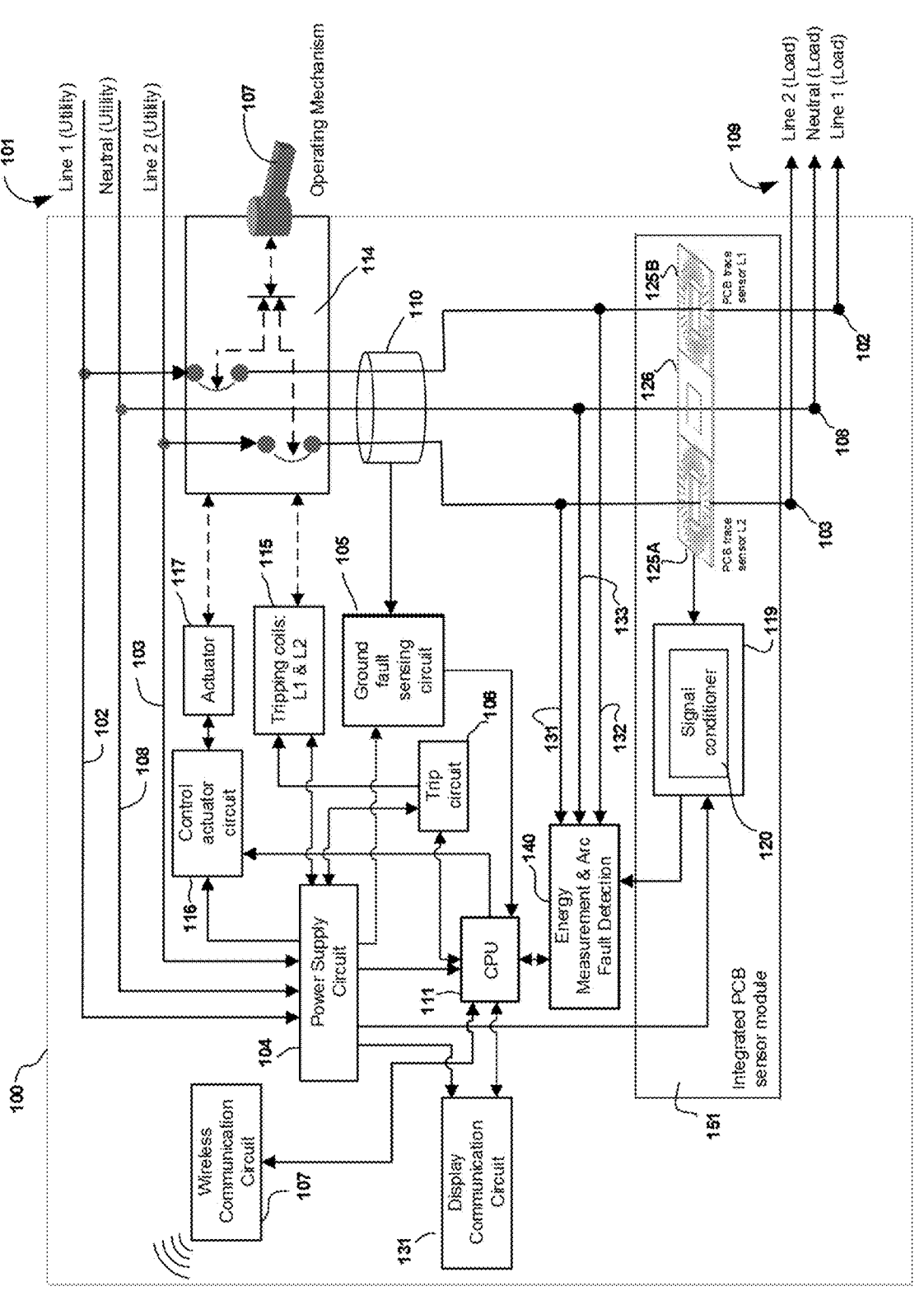
FIG. 1 shows a schematic diagram illustrating an exemplary current flow monitoring device that uses a low-profile current sensor PCB module with integrated trace current sensor(s) according to embodiments of the present disclosure.

Additional exemplary embodiments of the present disclosure are shown and described in Appendix A and Appendix B hereto, which is incorporated herein by reference.

DETAILED DESCRIPTION

This description and the accompanying drawings illustrate exemplary embodiments of the present disclosure and should not be taken as limiting, with the claims defining the scope of the present disclosure, including equivalents. Various mechanical, compositional, structural, electrical, and operational changes may be made without departing from the scope of this description and the claims, including equivalents. In some instances, well-known structures and techniques have not been shown or described in detail so as not to obscure the disclosure. Further, elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

In various embodiments, the system and method can relate to a device for signal conditioning and energy measurement in at least one current path. In various embodiments, a system and method are provided which employ an integrated Printed Circuit Board (PCB) module that can incorporate a PCB trace current sensor(s), signal conditioner (s) and associated embedded connectors on the same PCB assembly (PCBA) to provide a reduced-crosstalk, integrated low-profile current sensor PCB module. For example, the device can include an integrated low-profile current sensor PCB (e.g., an embedded PCB trace sensor(s)) as well as the signal conditioner(s) and embedded connectors on a PCB substrate of the PCBA. The signal conditioner can include for example a signal integrator and amplifier on the PCB substrate. Reduced-crosstalk can be achieved by avoiding among other things the use of lead wires to connect the sensor output signal of the trace sensor to the signal conditioner. In some embodiments, the integrated PCB module can also incorporate an energy and power usage system on the same PCB assembly to provide a reduced-crosstalk, integrated energy measurement module. For example, the device can include an integrated low-profile current sensor PCB (e.g., an embedded PCB trace sensor(s)), signal conditioner(s) and embedded connectors, as well as energy measurement/calculation system that can calculate energy and power consumption using, for example, line voltage, neutral voltage, and current signal supplied by an embedded PCB trace sensor(s). The energy measurement/calculation system can be provided on an integrated chip (IC), which is mounted on the PCB substrate. The energy measurement/ calculation IC can include processor(s) (e.g., processor(s), controller(s), processing circuitry, etc.), along with memory, which can be configured to measure/calculate energy (or energy usage/consumption), power usage/consumption and/ or other energy-related metric(s).

The integrated PCB modules also can provide various features, benefits and/or advantages, including among other things, for example:

Assembly improvement (e.g., decoupling main conductors from current sensor module by using eccentric split PCB sensors, etc.) as compared to existing architecture;

Modular, integrated solution for current flow monitoring devices including low profile PCB trace current sensor and energy measurement circuitry (e.g., All-in-one solution (Sensors+Electronics));

Compact card-size integrated module (e.g., no additional MCB length needed);

Simplified assembly by using eccentric split PCB trace sensor (e.g., an eccentric split non-invasive, low profile PCB sensor, can afford for retrofittable and modular energy measurement solution);

High accuracy energy measuring module using dedicated IC or μC/microcontroller (e.g., opens the possibility of adding a dedicated precise energy measurement chip (e.g., cirrus logic, TI, etc.));

Crosstalk reduction by embedded sensor connections (e.g., cross-talk impact reduction on the sensing system caused by the strong magnetic fields inside the MCB);

PCB sensor benefits (e.g., better manufacturing control from PCB technologies);

Cost savings on the manufacturing line by independent energy monitoring screening (e.g., Standalone testing possibility-does not need to assemble the final current path to test/validate the sensor system);

Design and implementation of efficiently expanding/enlarging energy monitoring architectures commercial references, more sustainable than conventional CTs, and production cost saving; and Creation of a cost-effective energy monitoring brick.

These and other example systems and methods or other features and benefits of the present disclosure are shown and/or described below and in the attached figures and Appendices (which are incorporated herein in their entirety).

Referring now to FIG. 1, a schematic diagram is shown for an exemplary current flow monitoring device 100 that uses a low-profile current sensor PCB module with an integrated PCB trace current sensor according to an embodiment of the present disclosure. The current flow monitoring device 100 in this example is a 2-pole electronic circuit breaker that is designed to monitor current flow and interrupt the flow upon occurrence of a fault condition. To this end, the breaker 100 includes a number of functional components or modules, some of which are represented here as blocks. It will be understood, of course, that each block shown here (and in subsequent figures) may be divided into several constituent blocks, or two or more blocks may be combined into a single block, within the scope of the present disclosure. For the purposes of discussion, the reference number 100 will be generally used herein to reference a current flow monitoring device (or types thereof), which may vary in function, operation and component(s), in accordance with various embodiments described herein.

As can be seen, the breaker 100 can receive utility lines or conductors 101, such as a first power line L1 or Line 1, a second power line L2 or Line 2 and a neutral conductor N or NEUTRAL connected to the line side (or its line-side connectors) of the breaker 100. Current from the utility power lines L1 and L2 are carried over main conductors 102 and 103 respectively to various loads connected to the load side (or its load-side connectors) of the breaker 100. A neutral conductor 108 connects the load neutrals to the utility neutral conductor. As shown, the breaker 100 outputs the signals received from lines L1, L2 and Neutral to corresponding load-side lines or conductors 109. The breaker 100 in this example includes a ground fault sensing circuit 105 connected to a ground fault sensor 110. The main conductors 102 and 103 pass through the ground fault sensor 110 and also through respective current sensors 125B and 125A. An integrator or other signal processing front end 119, which may include a signal conditioner 120, receives the signals from the current sensor 125A and provides the signals to an energy calculation (or measurement) and arc fault detection circuit(s) 140. Power for the energy calculation/measurement and arc fault detection circuit(s) 140, CPU 111, and other components in the breaker 100 is provided by a power supply circuit 104, as shown.

Operation of the breaker 100 is generally well known in the art and therefore only described briefly here. In general, the CPU 111, which may be a microcontroller, monitors current sample measurements obtained from the ground fault sensor 110 to detect occurrence of a fault condition in a known manner. Upon detection of a fault condition, the CPU 111 outputs a trip signal to a trip circuit 106 that actuates tripping coil(s) 115, which in turn opens a trip mechanism 114 (e.g., switch(es), relay(s), contact(s), etc.) to interrupt current flow through the breaker 100. A reset mechanism 107 allows a user to later set/reset the trip mechanism/switch 114 after a trip event. Energy and power usage is measured by the energy calculation circuit of the circuit(s) 140 using line voltages 131 and 132, neutral voltage 133, and current signal supplied by the signal processing front end 119. Arc fault detection is performed by the arc fault detection circuit of the circuit(s) 140 for the monitored lines or conductors 102, 103 associated with Lines 1, 2 respectively. A wireless communication circuit 107 (or wireline communication circuit) may be used to transmit trip data, current sample measurements, energy measurements, and other information to an external monitoring system, such as a power usage monitoring system, for analysis. A display communication circuit 131 may be used to transmit trip data, current sample measurements, energy measurements, and other information to a display for display or output thereof. Furthermore the CPU 111 may be configured to control the operation of the trip mechanism/switch 114, via control actuator circuit 116 and actuator 117, to selectively turn ON or OFF (or interrupt) current flow to the circuit and load(s) connected thereto downstream of the breaker 100, under certain conditions. For example, the CPU 111 may turn ON or OFF the flow of current on the main conductors according to commands received from a remote device via wireless communication circuit 107 or the detection of certain conditions at the breaker 100. The remote device may be part of a home automation system for regulating energy or power usage/consumption (e.g., turn ON or OFF according to schedule, or when energy usage satisfies or exceeds (or not) a predefined threshold, or when other conditions are detected).

In this example embodiment, the breaker 100 employs an integrated PCB sensor module 151 for energy monitoring, which incorporates the sensors 125A and 125B, the signal processing front end 119 with the signal conditioner 120, and embedded connectors for connecting components on a PCB substrate. Each sensor 125A and 125B can be a PCB trace current sensor formed on the PCB substrate. For example, each current sensor 125A, 125B can be a toroidal or Rogowski coil type current sensor in which the coil windings (e.g., primary and secondary windings) are formed from electrically conductive traces on the PCB substrate. As shown, the sensor opening can be a through-hole within the border or boundary of the PCB substrate, which is configured to receive a line conductor (e.g., L1 (102) or L2 (103)) therethrough for measuring current on the conductor. The PCB sensor module 151 also can include a non-sensor opening(s) to accommodate other components within the breaker 100, such as other conductors, e.g., the neutral conductor 108, which may not require current monitoring but may need to pass-through the PCB substrate along with the other conductors when the components of the breaker 100 are assembled.

The PCB trace current sensor can provide several advantages over conventional current sensors, including a reduced volume, small footprint, low profile, simple hardware architecture, easier assembly and installation, and is relatively inexpensive to manufacture compared to conventional current transformers. As an example, the PCB trace current sensor herein was found in one implementation to have about a 3× reduction in volume over an equivalent conventional current sensor. Furthermore, the integration of the signal processing front-end 119 (including the signal conditioner 120) and the PCB trace current sensor(s) along with other associated components (e.g., wiring, etc.) including embedded connectors (for connecting the components) into the PCB substrate of the PCB sensor module 151 can provide additional advantages over conventional designs, including but not limited to: reduced potential crosstalk or crosstalk error by using embedded connectors/connections (e.g., embedded conductive trace(s)) on the PCB substrate to couple/connect the component(s) of the front-end 119 (e.g., signal conditioner 120) with associated current sensor(s); improved installation and assembly of components for current flow monitoring device; and other benefits as described herein.

In some embodiments, the PCB sensor module 151 can include a signal processing front end 119 with signal conditioner 120 on the PCB substrate for each PCB trace current sensor (e.g., 125A or 125B) on the PCB substrate. The number of PCB trace current sensors and non-sensor opening(s) can depend on the application including the type of current flow monitoring device. The sensor opening(s) and non-sensor opening(s) of the PCB sensor module 151 can be configured by size, shape and dimension as well as position/location on the PCB substrate to receive counterpart components (e.g., L1, L2 and N conductors, etc.), depending on the application including the type of current flow monitoring device. In various embodiments, the sensor and non-sensor openings can be aligned along an axis (or not).

The flow monitoring device 100 of FIG. 1 is provided as an example. It should be understood that the flow monitoring device 100 of FIG. 1 can employ different types of PCB modules with different types of trace current sensor(s) and different or additional components on the PCB substrate which may implement different or additional functionality. The flow monitoring device 100 of FIG. 1 also can include different components and features depending on the type of flow monitoring device (e.g., circuit breaker, wiring device, metering device, an arc fault circuit interrupt (AFCI) device, a ground fault interrupt (GFI) receptacle wiring device, a GFI smart plug, etc.). Additional example embodiments are provided in the schematic diagrams of FIGS. 2, 3 and 4.

Figure 2:
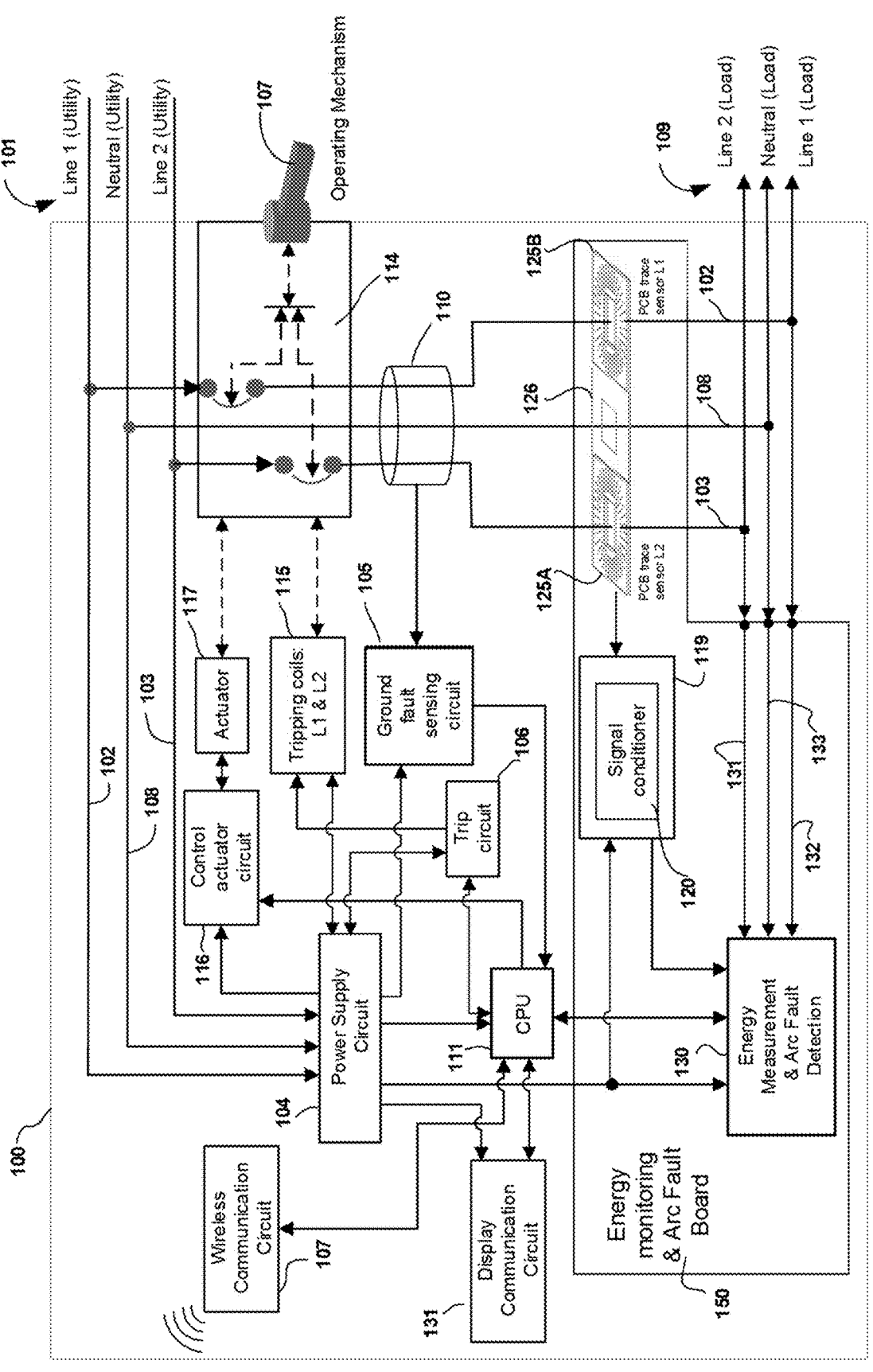
FIG. 2 shows a schematic diagram illustrating an exemplary current flow monitoring device that uses an energy measurement PCB module with integrated trace current sensor(s) according to embodiments of the present disclosure.

FIG. 2 is a schematic diagram for an exemplary current flow monitoring device 100 that uses an energy measurement PCB module with an integrated PCB trace current sensor according to an embodiment of the present disclosure. The current flow monitoring device 100 of FIG. 2 is basically the same as the monitoring device of FIG. 1, except that the monitoring device of FIG. 2 employs a PCB module which integrates the current sensor(s), signal processing front-end (including signal conditioner) and embedded connectors as well as the energy calculation/measurement circuit to provide an energy monitoring board. For example, as shown in FIG. 2, the monitoring device 100 can include a PCB module 150, which includes various components on a PCB substrate, such as trace current sensors 125A, 125B with respective sensor openings, non-sensor opening/passage 126, a signal processing front-end 119 with a signal conditioner 120, energy calculation/measurement and arc fault detection circuit(s) 130, and embedded connectors for connecting the components of the PCB module. The energy calculation/measurement and arc fault detection circuit(s) 130 can perform the same or similar functions as described above for the energy calculation/measurement and arc fault detection circuit(s) 140 of FIG. 1. Furthermore, as shown in FIG. 2, the output of the energy calculation/measurement circuit of the circuit(s) 130 can be feedback to the front-end 120 or its component(s) to tune the output of the front-end 119 or its component(s) such as the signal conditioner 120.

Figure 3:
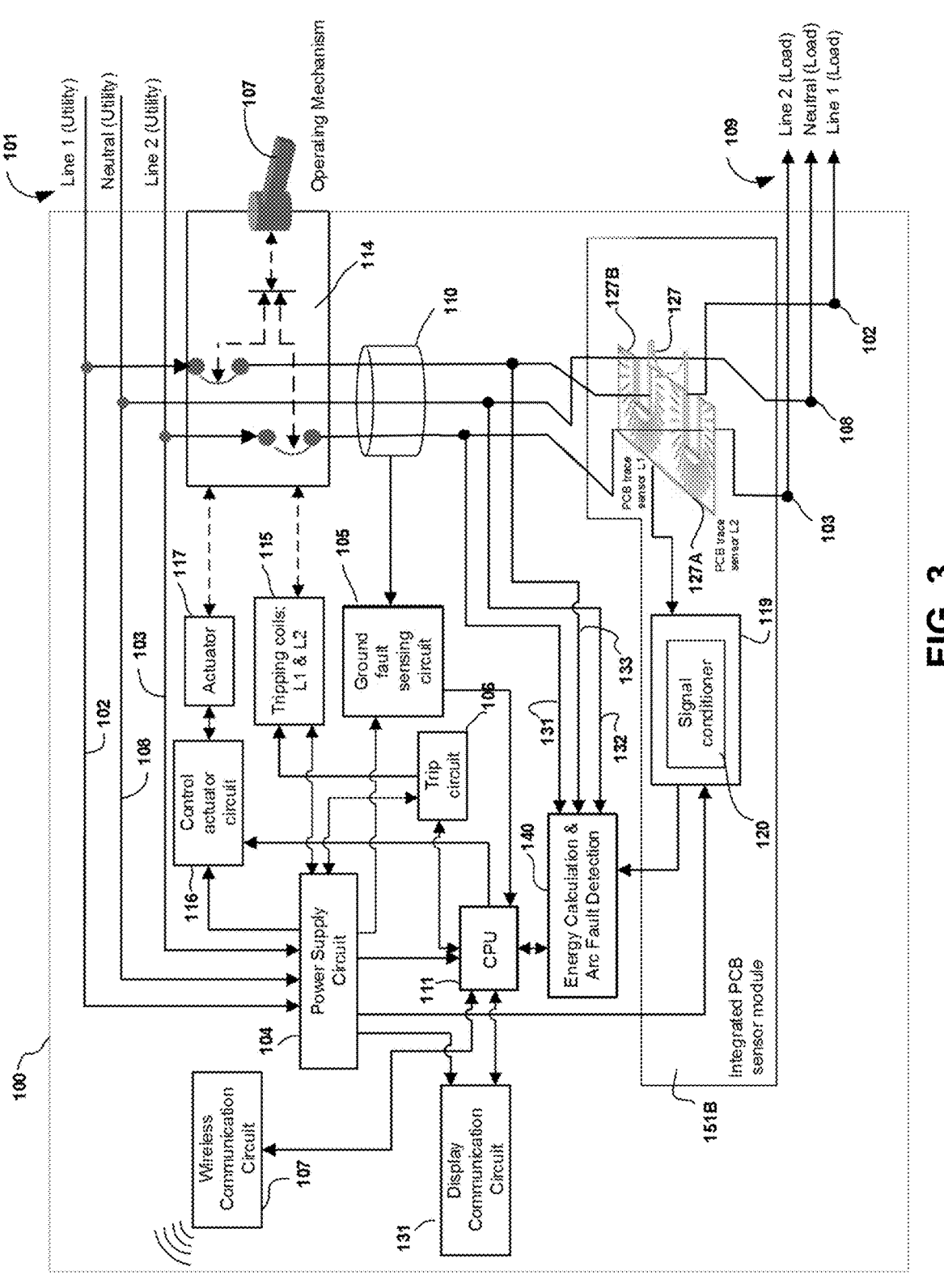
FIG. 3 shows a schematic diagram illustrating an exemplary current flow monitoring device that uses a low-profile current sensor PCB module with integrated trace current sensor(s) according to embodiments of the present disclosure.

FIG. 3 is a schematic diagram for an exemplary current flow monitoring device 100 that uses a low-profile current sensor PCB module with an integrated PCB trace current sensor according to yet another embodiment of the present disclosure. The current flow monitoring device 100 of FIG. 3 is basically the same as the monitoring device of FIG. 1, except that the monitoring device of FIG. 2 employs a current sensor PCB module 151B with a different design variation for the sensor openings and trace designs for trace current sensors 127A, 127B and the non-sensor opening(s) 127 than the PCB module 151 of FIG. 1. Instead of these openings being formed within the border or boundary of the PCB substrate as in the example of FIG. 1, the sensor/non-sensor opening(s) for the conductors of the example of FIG. 3, such as L1, L2 and neutral, take the form of notches which are formed on a side of the PCB substrate. In this way, the PCB module 151B, with the integrated current sensors 127A, 127B can be separately tested, easily assembled and installed into the current flow monitoring device 100, and easily removed from the current flow monitoring device 100. In various embodiments, the notches can be formed or positioned and the same or different sides of the PCB substrate.

Figure 4:
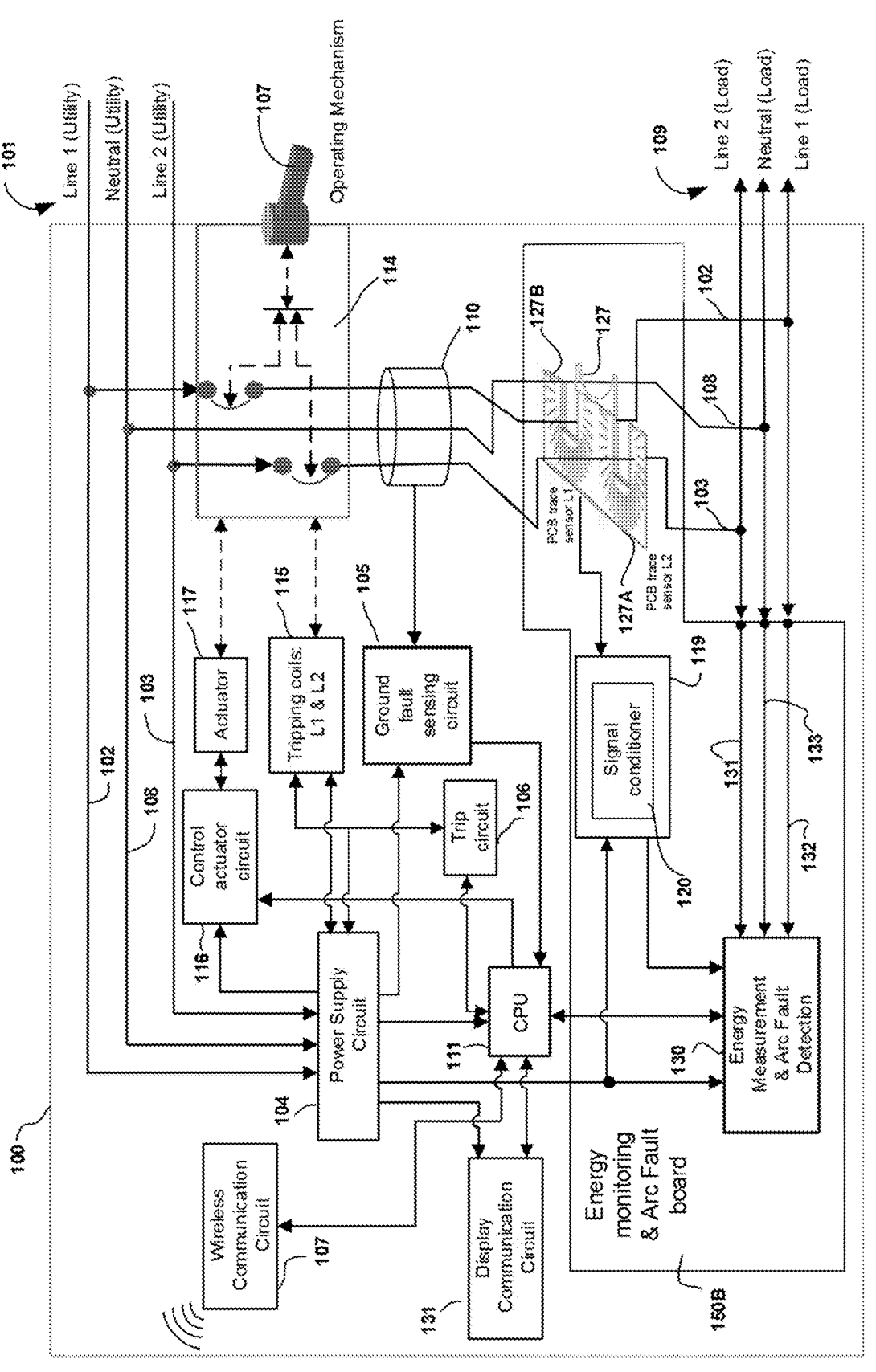
FIG. 4 shows a schematic diagram illustrating an exemplary current flow monitoring device that uses an energy measurement PCB module with integrated trace current sensor(s) according to embodiments of the present disclosure.

FIG. 4 is a schematic diagram for an exemplary current flow monitoring device 100 that uses an energy measurement PCB module with an integrated PCB trace current sensor according to an embodiment of the present disclosure. The current flow monitoring device 100 of FIG. 4 is basically the same as the monitoring device of FIG. 3, except that the monitoring device of FIG. 3 employs a PCB module which integrates the current sensor(s), signal processing front-end (including signal conditioner) and embedded connectors as well as the energy calculation/measurement circuit to provide an energy monitoring board. For example, as shown in FIG. 4, the monitoring device 100 can include a PCB module 150B, which includes various components on a PCB substrate, such as trace current sensors 127A, 127B with respective sensor openings, non-sensor opening/passage 127, a signal processing front-end 119 with a signal conditioner 120, energy calculation/measurement and arc fault detection circuit(s) 130, and embedded connectors for connecting the components of the PCB module. The energy calculation/measurement and arc fault detection circuit(s) 130 can perform the same or similar functions as described above for the energy calculation/measurement and arc fault detection circuit(s) 140 of FIG. 1. Furthermore, as shown in FIG. 4, the output of the energy calculation/measurement circuit of the circuit(s) 130 can be feedback to the front-end 120 or its component(s) to tune the output of the front-end 119 or its component(s) such as the signal conditioner 120.

Figure 5:
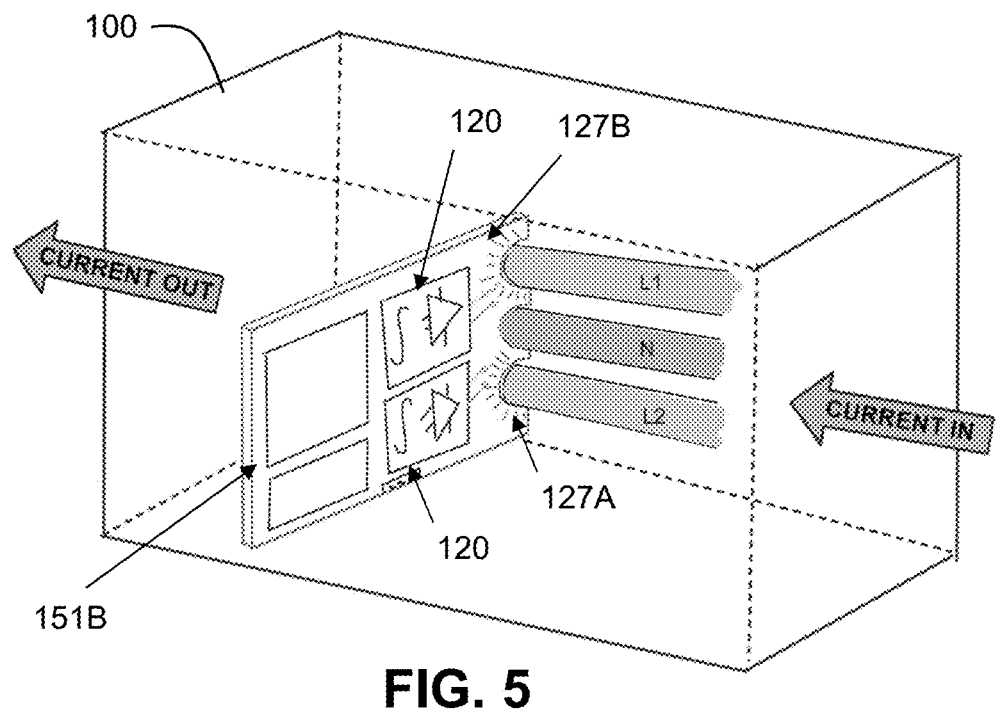
FIG. 5 shows an exemplary conceptual diagram of an integrated energy measurement PCB module using PCB trace sensor(s) in a current flow monitoring device according to embodiments of the present disclosure.
Figure 6:
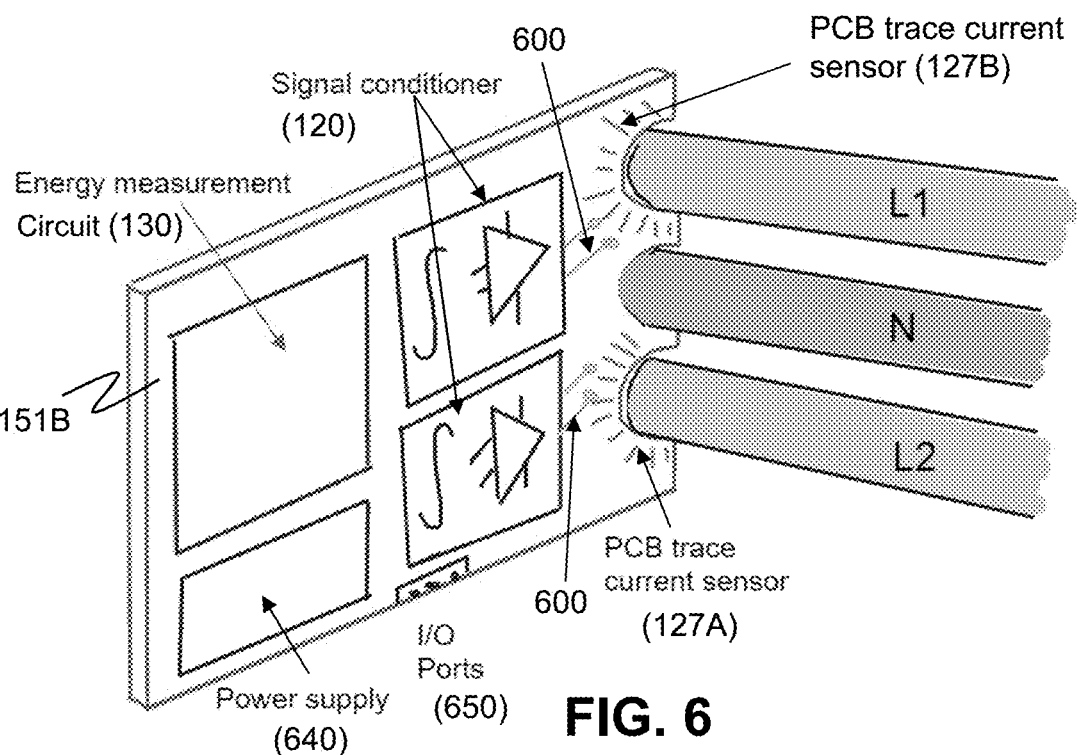
FIG. 6 shows a high level block diagram of an exemplary integrated energy measurement PCB module using PCB trace sensor(s) according to embodiments of the present disclosure.

FIG. 5 shows an exemplary conceptual diagram of an integrated energy measurement PCB module 151B using PCB trace sensor(s) in a current flow monitoring device 100 according to embodiments of the present disclosure. As shown in FIG. 5, the flow monitoring device 100 can receive and output current received on power lines L1 and L2 and neutral conductor N from an upstream source (e.g., Utility, etc.). As shown in FIG. 6, the PCB module 151B can include trace current sensors 127A, 127B each with a sensor opening for receiving a conductor (e.g., power line L2 or power line L1) to be monitored, a non-sensor opening to allow passage of a conductor (e.g., neutral conductor N), signal conditioner 120 for each sensor 127A, 127B, embedded connectors 600 (e.g., conductive traces, etc.) for connecting the sensor output to the signal conditioner 120 (or signal processing front-end), and input/output (I/O) ports 650 for inputting information to the PCB module 150 and outputting information from the PCB module 150. The PCB module 151B also can include an energy calculation/measurement circuit 130 and a power supply 640 for powering components of the PCB module such as the energy calculation/measurement circuit 130. The power supply 640 can be connected to the main conductors L1, L2 and N or other power source, or can be an independent power source (e.g., battery, etc.).

In this example embodiment, the sensor openings and non-sensor opening are notches (e.g., notches, grooves, slots, etc.) on a side of the PCB substrate, which are aligned along an axis. Such a configuration can enable the PCB module to be tested, and then assembled or installed onto the flow monitoring device. Furthermore, the PCB module also can be easily disassembled from the flow monitoring device, tested and replaced as needed. The notches allow for the conductors to be inserted therein and onto the PCB substrate when assembling the PCB module into the flow monitoring device 100 or to be removed therefrom when disassembling the PBM module from the flow monitoring device 100.

Although the sensor and non-sensor openings are shown as notches having an arcuate shape (e.g., generally circular arc) in the example of FIGS. 5 and 6, the energy measurement PCB module 151B can employ sensor and non-sensor openings as well as sensor traces having different shapes, dimensions, size, position and numbers on the PCB substrate depending on the application. The PCB substrate also can include one or more substrate layers, and can be made of a dielectric or non-electrically-conductive material(s) or composite.

Figure 7:
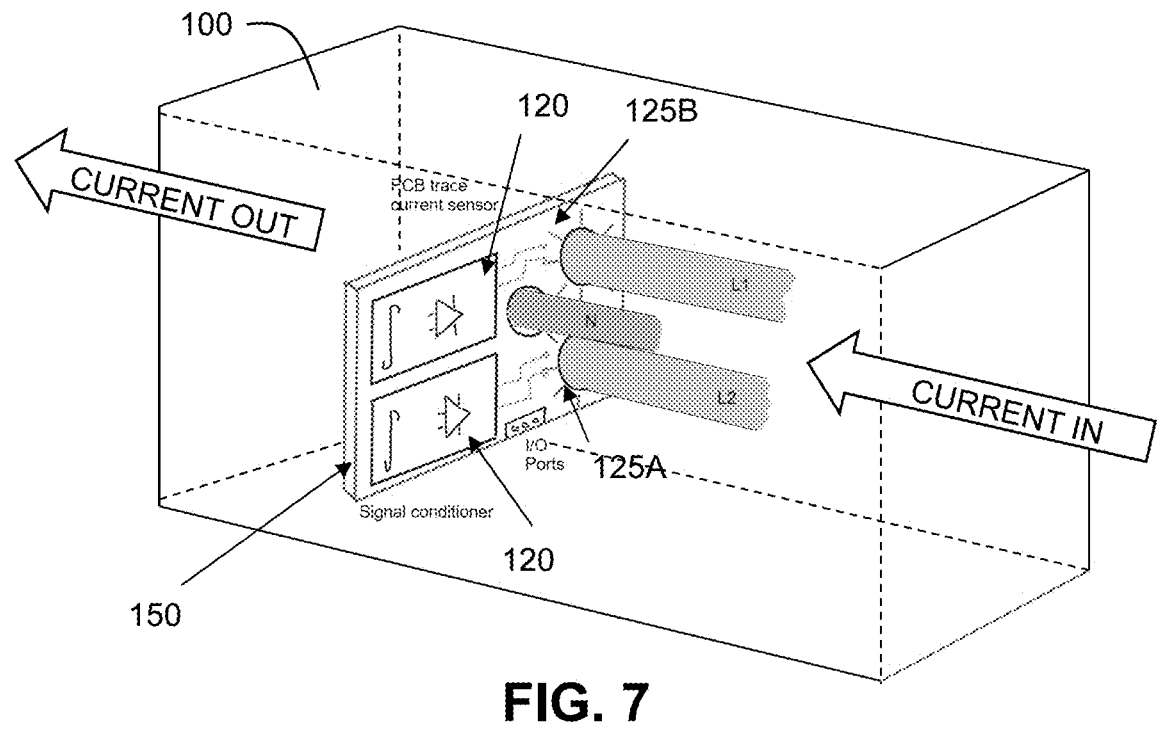
FIG. 7 shows an exemplary conceptual diagram of an integrated current sensor PCB module using PCB trace sensor(s) in a current flow monitoring device according to embodiments of the present disclosure.
Figure 8:
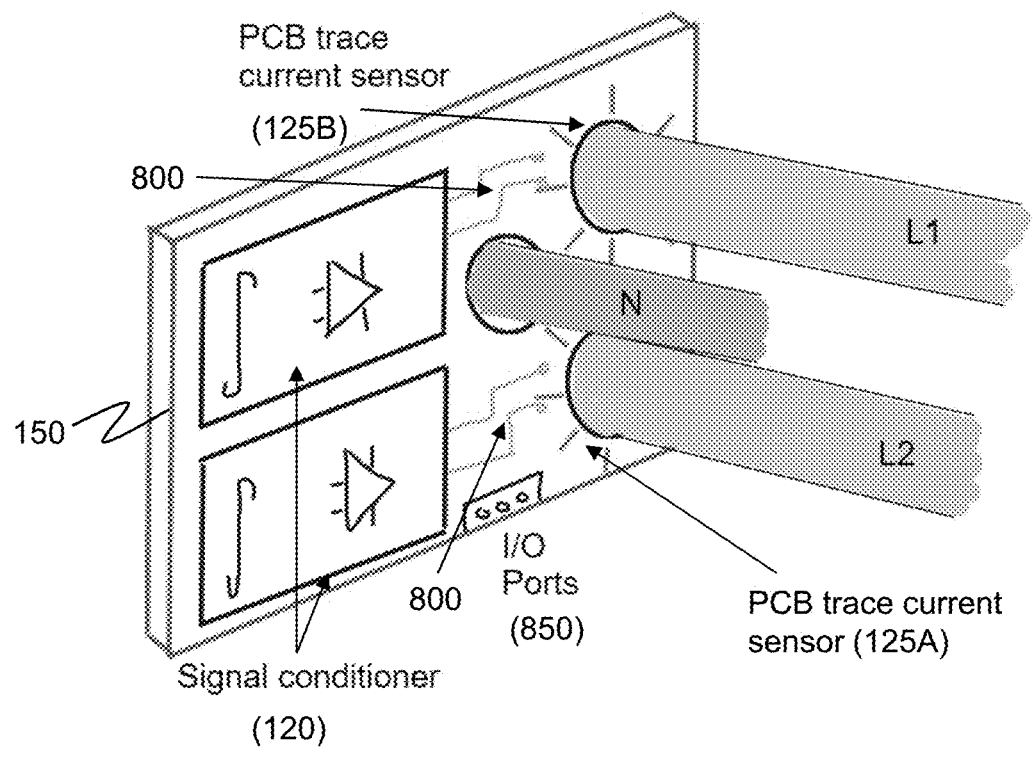
FIG. 8 shows a high level block diagram of an exemplary integrated current sensor PCB module using PCB trace sensor(s) according to embodiments of the present disclosure.

FIG. 7 shows an exemplary conceptual diagram of an integrated current sensor PCB module 150 using PCB trace sensor(s) in a current flow monitoring device 100 according to embodiments of the present disclosure. As shown in FIG. 7, the current flow monitoring device 100 can receive and output current received on power lines L1 and L2 and neutral conductor N from an upstream source (e.g., Utility, etc.). As further shown in FIG. 8, the PCB module 150 can include trace current sensors 125A, 125B each with a sensor opening for receiving a conductor (e.g., power line L2 or power line L1) to be monitored, a non-sensor opening to allow passage of a conductor (e.g., neutral conductor N), signal conditioner 120 for each sensor 125A, 125B, embedded connectors 800 (e.g., conductive traces, etc.) for connecting the sensor output to the signal conditioner 120 (or signal processing front-end), and input/output (I/O) ports

850 for inputting information to the PCB module 150 and outputting information from the PCB module 150. In various embodiments, the PCB module 150 can output current measurements to an energy calculation/measurement circuit of the flow monitoring device 100.

Figure 9:
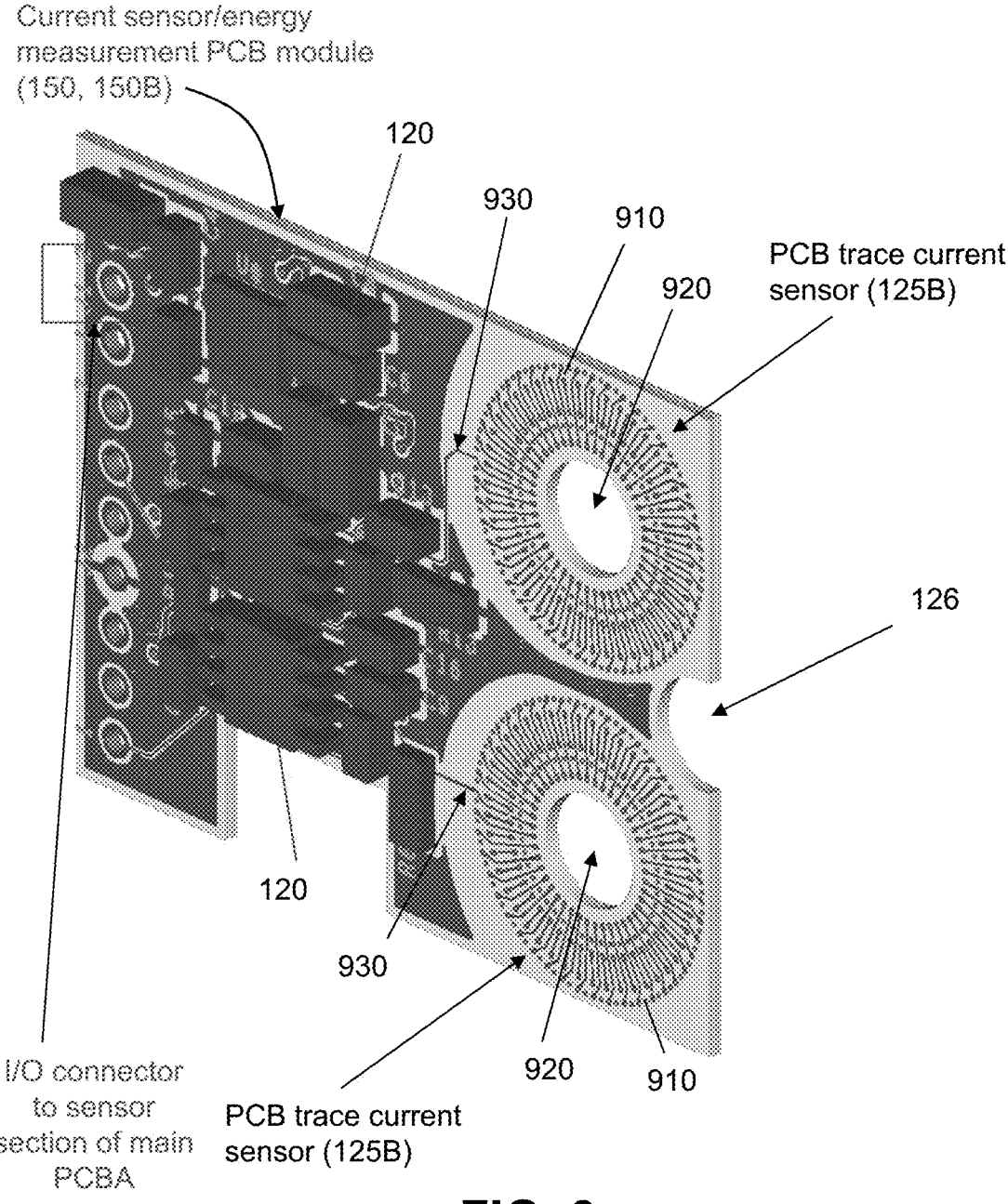
FIG. 9 shows a perspective view of an exemplary integrated current sensor/energy measurement PCB module using PCB trace sensor(s) according to embodiments of the present disclosure.

In this example embodiment, the sensor openings and non-sensor opening are circular through-holes formed within the border or boundary of the PCB substrate, and the openings are positioned in a triangular formation. Although the sensor and non-sensor openings are shown as circular through-holes in the example of FIGS. 7 and 8, the current sensor PCB module 150 can employ sensor and non-sensor openings as well as sensor traces having different shapes, dimensions, size, position and numbers on the PCB substrate depending on the application. The PCB substrate also can include one or more substrate layers, and can be made of a dielectric or non-electrically-conductive material(s) or composite FIG. 9 shows a perspective view of a variation of an exemplary integrated current sensor/energy measurement PCB module 150, 150B using PCB trace sensor(s) 127A. 127B according to embodiments of the present disclosure. As shown in FIG. 9, the PCB module 150, 150B can include trace current sensors 125A, 125B each with a sensor opening 920 for receiving a conductor (e.g., power line L2 or power line L1) to be monitored, a non-sensor opening 126 to allow passage of a conductor (e.g., neutral conductor N), signal conditioner 120 for each sensor 125A, 125B, embedded connectors 930 (e.g., conductive traces, etc.) for connecting the sensor output to the signal conditioner 120 (or signal processing front-end), and input/output (I/O) connector to sensor section of main PCBA. In some embodiments, the PCB module 150, 150B also can include an energy calculation/measurement circuit (e.g., 130) and a power supply for powering components of the PCB module such as the energy calculation/measurement circuit. The power supply can be connected to the main conductors L1, L2 and N or other power source, or can be an independent power source (e.g., battery, etc.).

Figure 10:
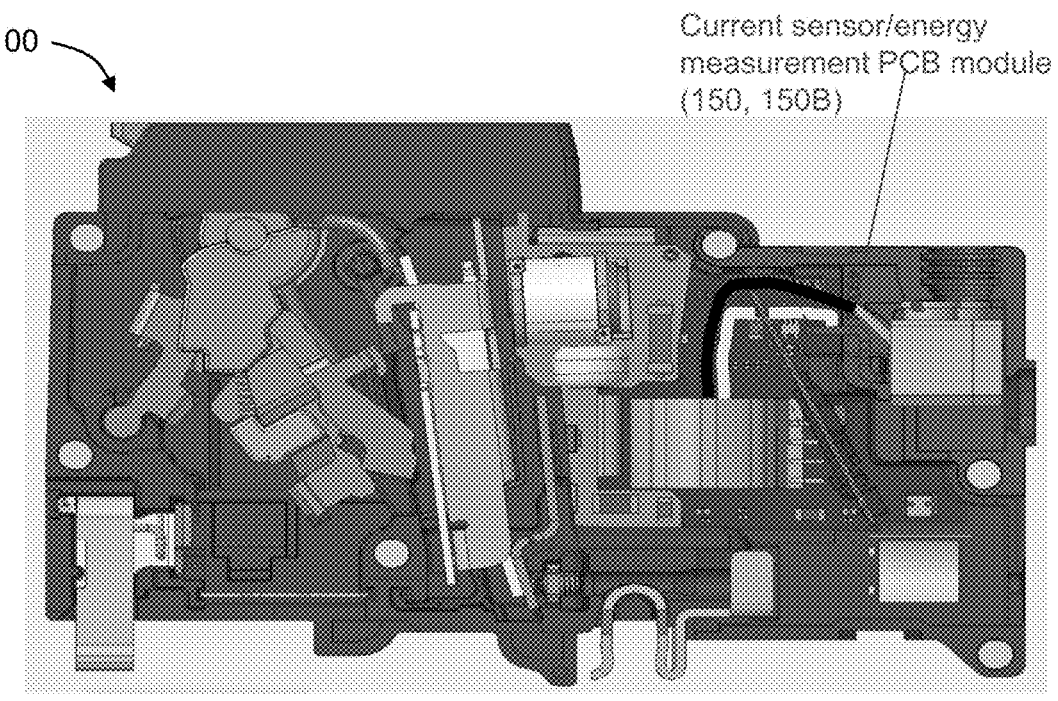
FIG. 10 shows a cross-sectional view of exemplary components of an exemplary current flow monitoring device, such as a miniature circuit breaker (MCB), including the PCB module of FIG. 9 according to embodiments of the present disclosure.

In this example embodiment, the sensor openings are central circular through-holes formed within the borders or edges of the PCB substrate, the non-sensor opening is a notch, and the openings are positioned in a triangular formation. Although the sensor openings and non-sensor opening are shown as circular through-holes and notch respectively in the example of FIG. 9, the current sensor PCB module 150, 150B can employ sensor and non-sensor openings as well as sensor traces having different shapes, dimensions, size, position and numbers on the PCB substrate depending on the application. The PCB substrate also can include one or more substrate layers, and can be made of a dielectric or non-electrically-conductive material(s) or composite FIG. 10 shows a cross-sectional view of exemplary components of an exemplary current flow monitoring device 100, such as a miniature circuit breaker (MCB), including the PCB module 150, 150B of FIG. 9 according to embodiments of the present disclosure. The MCB also can include example components such as load-side connectors, line-side connectors, main conductors (e.g., L1, L2 and N), trip circuit, coils and mechanism, CPU, actuator circuit and actuator, operating mechanism (e.g., handle, etc.), communication circuit/device(s) and other components known to be employed in an MCB.

Figure 11:
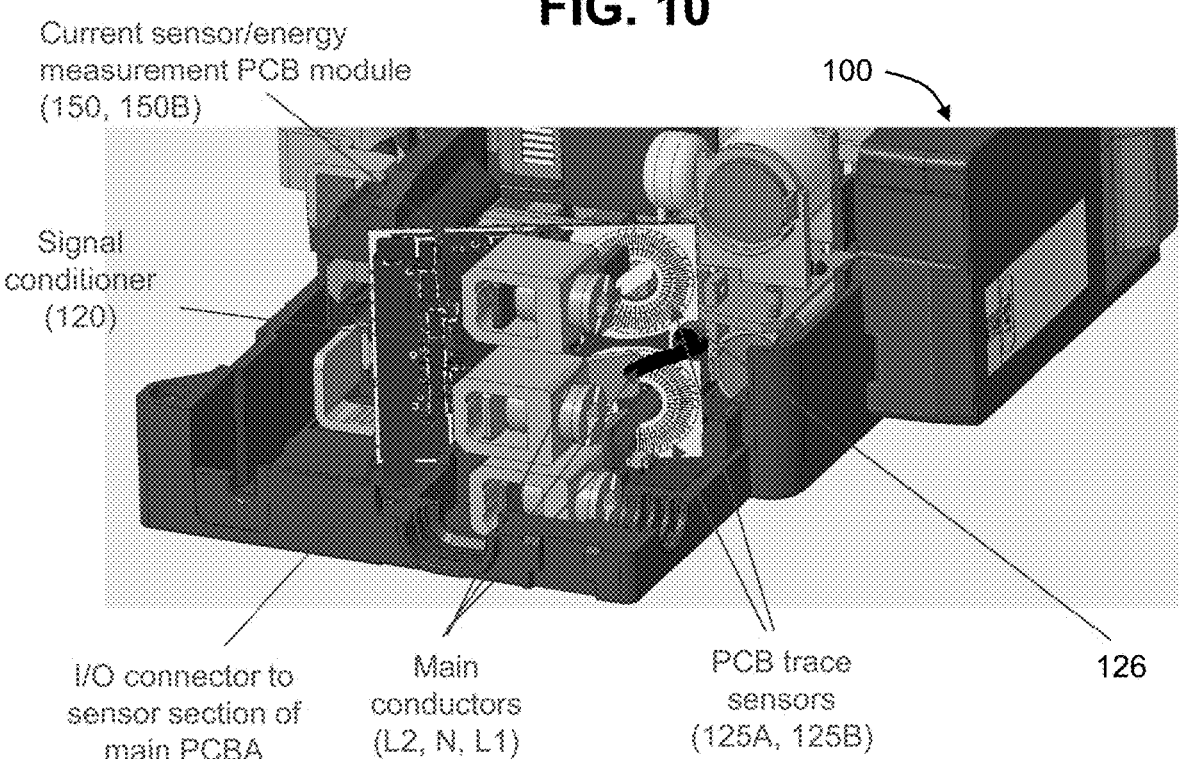
FIG. 11 shows a partial view of exemplary components of an exemplary current flow monitoring device, such as a miniature circuit breaker (MCB), including the PCB module of FIGS. 9 and 10 in relation to the main conductors according to embodiments of the present disclosure.

FIG. 11 shows a partial view of exemplary components of an exemplary current flow monitoring device, such as a miniature circuit breaker (MCB), including the PCB module of FIGS. 9 and 10 in relation to the main conductors according to embodiments of the present disclosure. As shown in the example of FIGS. 10 and 11, the PCB module 150, 150B is arranged between the load-side connectors (or terminals) and the trip mechanism within the housing of the MCB.

Figure 12:
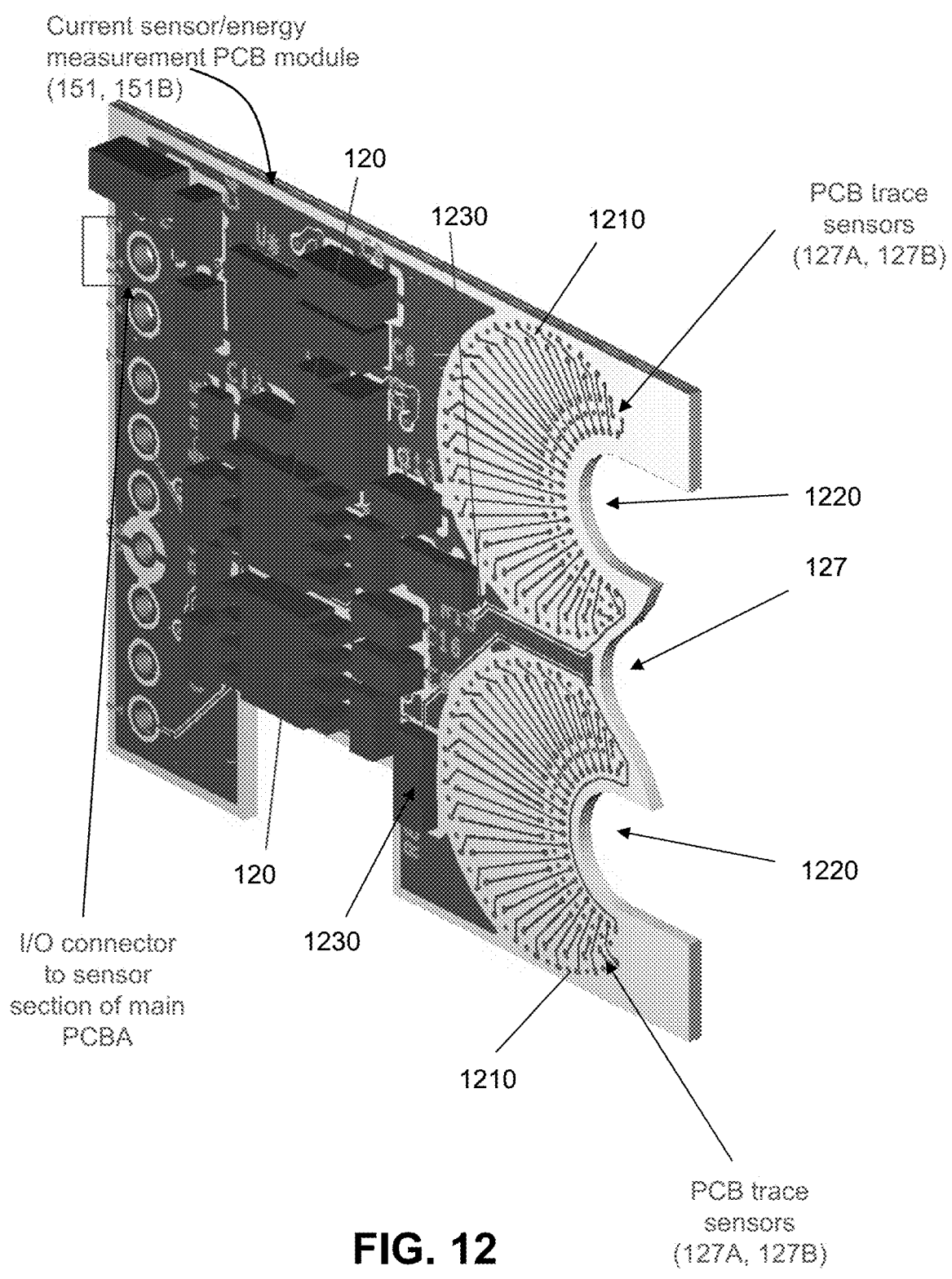
FIG. 12 shows a perspective view of an exemplary integrated current sensor/energy measurement PCB module using PCB trace sensor(s) according to embodiments of the present disclosure.

FIG. 12 shows a perspective view of a variation of an exemplary integrated current sensor/energy measurement PCB module 151/151B using PCB trace sensor(s) 127A, 127B according to embodiments of the present disclosure. As shown in FIG. 12, the PCB module 151, 151B can include trace current sensors 127A, 127B each with a sensor opening 1220 for receiving a conductor (e.g., power line L2 or power line L1) to be monitored, a non-sensor opening 127 to allow passage of a conductor (e.g., neutral conductor N), signal conditioner 120 for each sensor 127A, 127B, embedded connectors 1230 (e.g., conductive traces, etc.) for connecting the sensor output to the signal conditioner 120 (or signal processing front-end), and input/output (I/O) connector to sensor section of main PCBA. In some embodiments, the PCB module 151, 151B also can include an energy calculation/measurement circuit (e.g., 130) and a power supply for powering components of the PCB module such as the energy calculation/measurement circuit. The power supply can be connected to the main conductors L1, L2 and N or other power source, or can be an independent power source (e.g., battery, etc.).

In this example embodiment, the sensor openings and non-sensor opening are notches (e.g., notches, grooves, slots, etc.) on a side of the PCB substrate, which are aligned along an axis. The traces of the current sensors 127A, 127B extend radially around an arcuate portion (e.g., circular arc portion) of the notch for each sensor. Such a configuration can enable the PCB module to be tested, and then assembled or installed onto the flow monitoring device. Furthermore, the PCB module also can be easily disassembled from the flow monitoring device, tested and replaced as needed. The notches allow for the conductors to be inserted therein and onto the PCB substrate when assembling the PCB module into the flow monitoring device 100 or to be removed therefrom when disassembling the PCM module from the flow monitoring device 100.

Although the sensor and non-sensor openings are shown as notches having an arcuate shape (e.g., generally circular arc) in the example of FIG. 12, the PCB module 151, 151B can employ sensor and non-sensor openings as well as sensor traces having different shapes, dimensions, size, position and numbers on the PCB substrate depending on the application. The PCB substrate also can include one or more substrate layers, and can be made of a dielectric or non-electrically-conductive material(s) or composite.

Figures 13, 14:
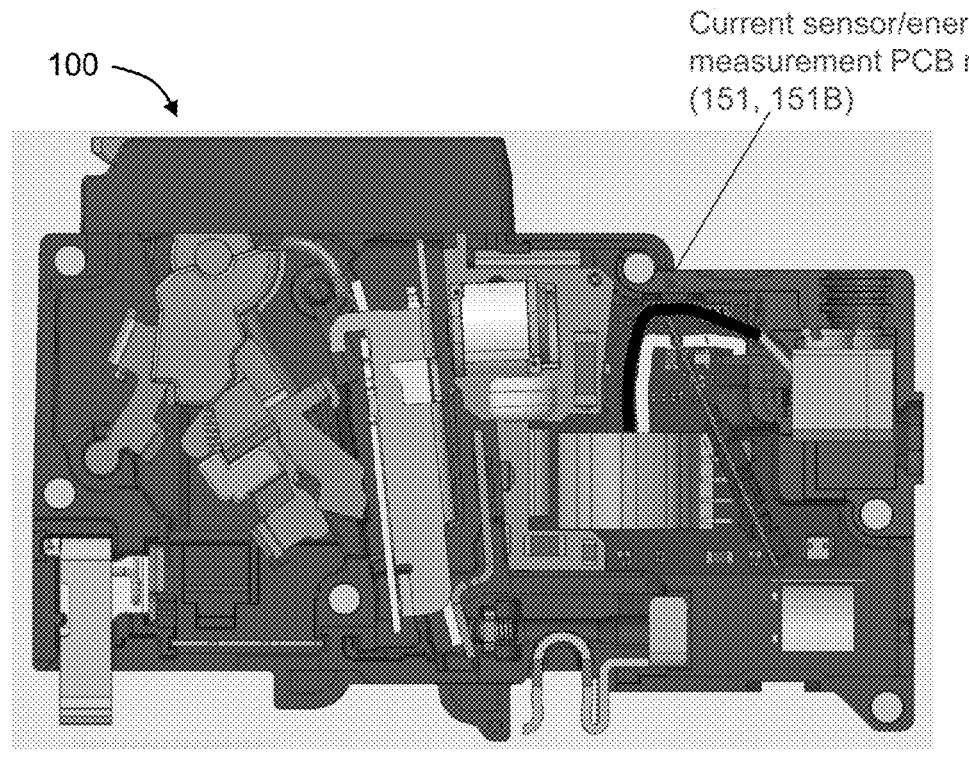
FIG. 13 shows a cross-sectional view of exemplary components of an exemplary current flow monitoring device, such as a miniature circuit breaker (MCB), including the PCB module of FIG. 12 according to embodiments of the present disclosure.
FIG. 14 shows a partial view of exemplary components of an exemplary current flow monitoring device, such as a miniature circuit breaker (MCB), including the PCB module of FIGS. 12 and 13 in relation to the main conductors according to embodiments of the present disclosure.

FIG. 13 shows a cross-sectional view of exemplary components of an exemplary current flow monitoring device 100, such as a miniature circuit breaker (MCB), including the PCB module 151, 151B of FIG. 12 according to embodiments of the present disclosure. The MCB also can include example components such as load-side connectors, line-side connectors, main conductors (e.g., L1, L2 and N), trip circuit, coils and mechanism, CPU, actuator circuit and actuator, operating mechanism (e.g., handle, etc.), communication circuit/device(s) and other components known to be employed in an MCB.

FIG. 14 shows a partial view of exemplary components of an exemplary current flow monitoring device, such as a miniature circuit breaker (MCB), including the PCB module of FIGS. 12 and 13 in relation to the main conductors according to embodiments of the present disclosure. As shown in the example of FIGS. 13 and 14, the PCB module 151, 151B is arranged between the load-side connectors (or terminals) and the trip mechanism within the housing of the MCB.

In accordance with further embodiments, an energy monitoring subsystem of a current flow monitoring device, including a circuit breaker or other device as described herein, can employ a PCB module(s) or system that can incorporate the use of a flexible connector to connect one PCB sub-module having a PCB trace sensor on a PCB section/substrate to another PCB sub-module having a PCB section/substrate with other electronic/electrical components, instead of having the sensor and the other electronic/electrical components on the same PCB section/substrate. The other electronic/electrical components can include circuit(s) for conditioning and/or processing signals from the PCB trace sensor(s), power supply circuit, connector(s) or connector interface(s) for physically, electrically and/or communicatively connecting to a remote device(s) (or components thereof), and/or other electronic/electrical components. The connector(s)/connector interface(s) can include I/O ports or other I/O connector types on the PCB substrate.

The flexible connector can be a flat, flexible connector, which can physically, electrically and/or communicatively link two separate PCB sections/substrates (or components thereof), and can provide for one or more communication pathways (e.g., communication lines) to enable communication of signals/data between the connected PCB sections/substrates, e.g., from the PCB trace sensor(s) to another PCB section(s)/substrate(s). These communicated signals can, for example, include energy-related measurements (e.g., current or voltage) by the PCB trace sensor of energy signals on a conductor (e.g., a line conductor or other conductor) of the current flow monitoring device. The dimension of the flexible connector and PCB sections/substrates, including their size and shape, can be designed according to the space-limitations associated with the application. In various embodiments, the flexible connector can be a flexible flat cable (FFC), ribbon-type cable, or other suitable cable connector for use with printed circuit boards.

Accordingly, the use of a flexible connector(s) in combination with a PCB trace sensor(s) and other PCB sections/substrates can provide for additional flexibility in the design and placement of energy monitoring or other subsystem(s)/sub-module(s) in a current flow monitoring device, including but not limited to single- or multi-pole circuit protective devices (e.g., circuit breakers, etc.) and other devices described herein, which may have space limitations. Various examples of energy monitoring configurations using a PCB trace sensor(s) and flexible connector(s) are described below with reference to the examples in FIGS. 15 through 21.

Figure 15:
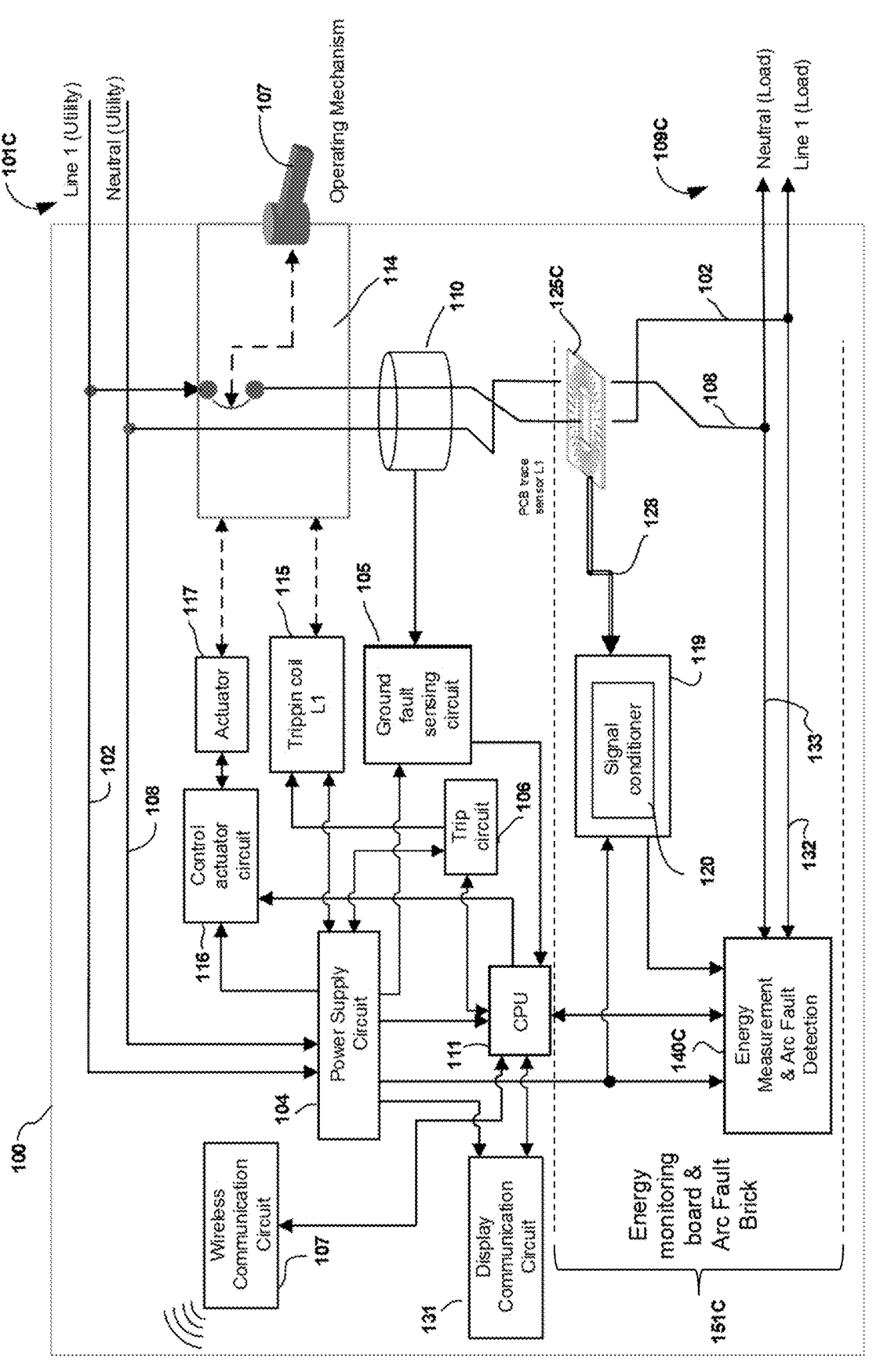
FIG. 15 shows a schematic diagram illustrating an exemplary current flow monitoring device that uses a low-profile current sensor PCB module with a PCB trace current sensor(s) connectable to other electronics across a flexible connector according to embodiments of the present disclosure.

FIG. 15 shows a schematic diagram illustrating an exemplary current flow monitoring device 100 that uses a low-profile current sensor PCB module with a PCB trace current sensor connectable to other PCB section/substrate (with electronic/electrical components) across a flexible connector, according to yet another embodiment of the present disclosure. The current flow monitoring device 100 of FIG. 15 is basically the same as the monitoring device of FIG. 1, except that the monitoring device of FIG. 15 is directed to an example 1-pole breaker with Line 1 and Neutral (e.g., Line 1 and Neutral in 101C and 109C) in comparison to the 2-pole breaker example in FIG. 1. Furthermore, the monitoring device of FIG. 15 employs a PCB module 151C, e.g., a PCB-based energy monitoring subsystem, with a different design variation in comparison to the PCB module 151 of FIG. 1.

For example, in the energy monitoring subsystem, the PCB trace sensor 125C is connected to other PCB section/substrate with electronic/electrical components (including signal conditioning circuit, signal processing circuit, and/or other electronic/electrical components), across a flexible connector. The signal conditioning circuit can include the signal processing front-end 119 with a signal conditioner 120, which can include an integrator, amplifier(s), filter(s) and/or other electrical components. The signal processing circuit can include an energy measurement circuit and an arc fault detection circuit, as shown by block 140C. The block 140C can perform the same or similar functions as the energy measurement circuit of the circuit(s) 140 of FIG. 1 as well as perform other functions such as arc fault detection for the monitored line or conductor 102 associated with Line 1. In this example embodiment, the PCB module 151C, with the PCB trace sensor 125 and flexible connector 128, also can be separately tested, easily assembled and installed into the current flow monitoring device 100, easily removed from the current flow monitoring device 100, and/or retrofitted into existing current flow monitoring devices.

The flow monitoring device 100 of FIG. 15 is provided as an example. It should be understood that the energy monitoring subsystem of the flow monitoring device 100 of FIG. 15 can employ different numbers and types of PCB sub-modules with different types of trace current sensor(s) and different combinations of electronic/electrical components on the PCB substrates to implement different or additional functionality. The energy monitoring subsystem also can include different components and features depending on the type of flow monitoring device (e.g., circuit breaker, wiring device, metering device, etc.). The he PCB trace sensor in the example of FIG. 15 also can have a varied design, such as a different overall size and shape, different opening shape (e.g., a notch, etc.) and so forth.

Furthermore, in this example, the current flow monitoring device is a 1-pole device. In multi-pole devices with multiple conductors to monitor, such devices can employ a plurality of energy monitoring subsystems each with a single PCB current trace sensor connected to a respective separate PCB substrate (having electronic/electrical components) across a flexible connector, or can employ an energy monitoring subsystem with a plurality of PCB current trace sensors connected to a separate PCB substrate (having electronic/electrical components) across respective flexible connectors.

Figure 16:
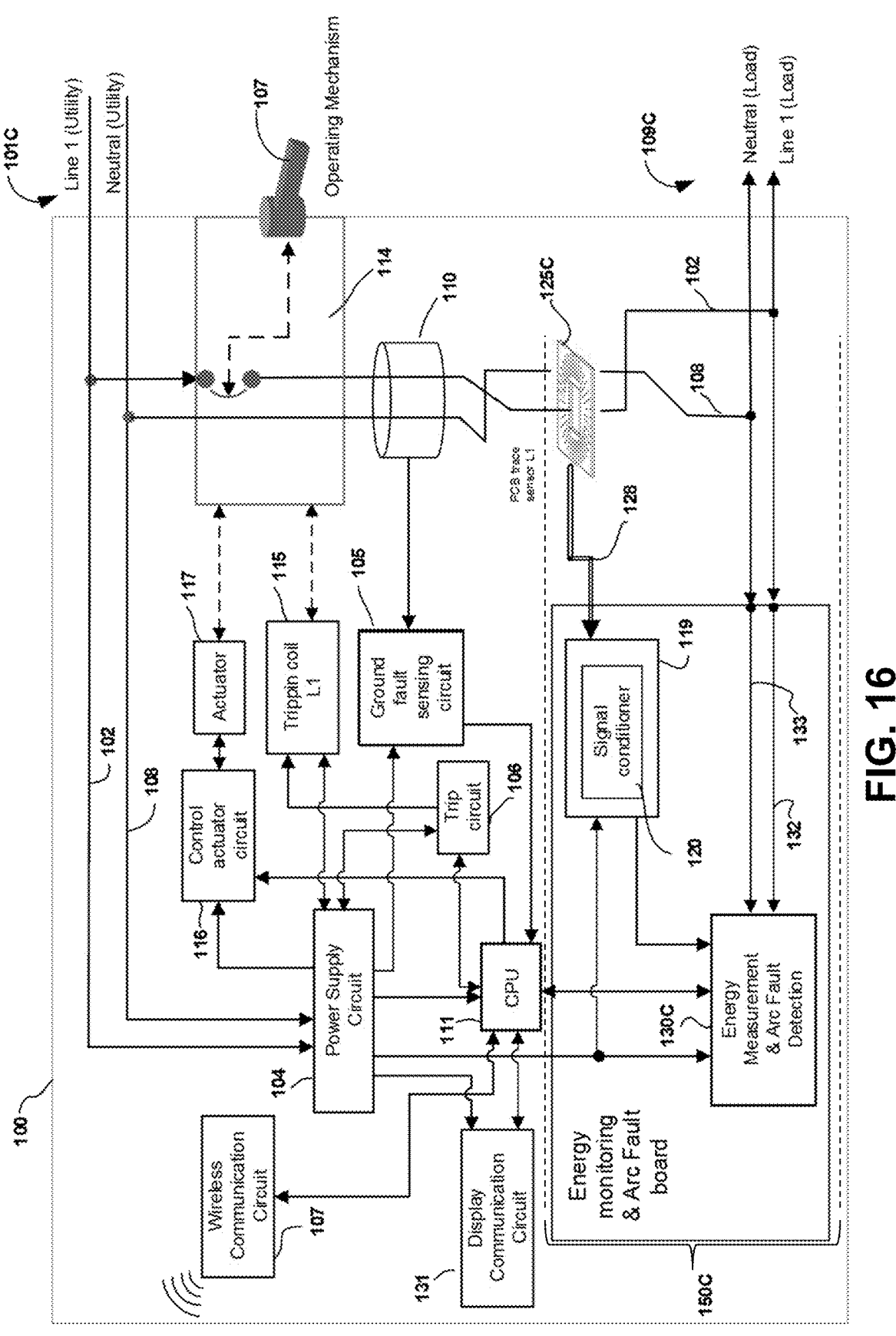
FIG. 16 shows a schematic diagram illustrating an exemplary current flow monitoring device that uses a PCB trace current sensor(s) for connecting to other electronic/electrical component(s), such as a signal conditioner, on another PCB substrate according to embodiments of the present disclosure.

FIG. 16 shows a schematic diagram illustrating an exemplary current flow monitoring device 100 that uses a PCB trace current sensor(s) which is connected to a separate PCB substrate (having electronic/electrical components) across a flexible connector according to another embodiment of the present disclosure.

The current flow monitoring device 100 of FIG. 16 is basically the same as the monitoring device of FIG. 15, except that the monitoring device of FIG. 16 employs a PCB module 150C, e.g., PCB-based energy monitoring subsystem, with a different design variation in comparison to the PCB module 151C of FIG. 1. For example, in the energy monitoring system of FIG. 16, the other PCB substrate or sub-module (which is connected to the PCB trace sensor 125C across a flexible connector 128) integrates a signal processing front-end (including a signal conditioner) as well as the energy calculation/measurement circuit and arc fault detection circuit on the same PCB substrate to provide an energy monitoring board and arc fault brick.

For example, as shown in FIG. 16, the monitoring device 100 can include a PCB module 150C, which includes a first PCB sub-module having a PCB trace sensor 125C, a second PCB sub-module having another PCB substrate with electronic/electrical components, and a flexible connector 128 which connects the PCB trace sensor 125C of the first PCB sub-module (or its component(s)) and the other PCB substrate of the second PCB sub-module (or its component(s)). The second PCB sub-module can, for example, include the signal processing front-end 119 with a signal conditioner 120, and a circuit(s) 130C for energy measurement and arc fault detection. The circuit(s) 130C can perform the same or similar functions as described above for the circuit(s) 140C of FIG. 15.

Figure 17A:
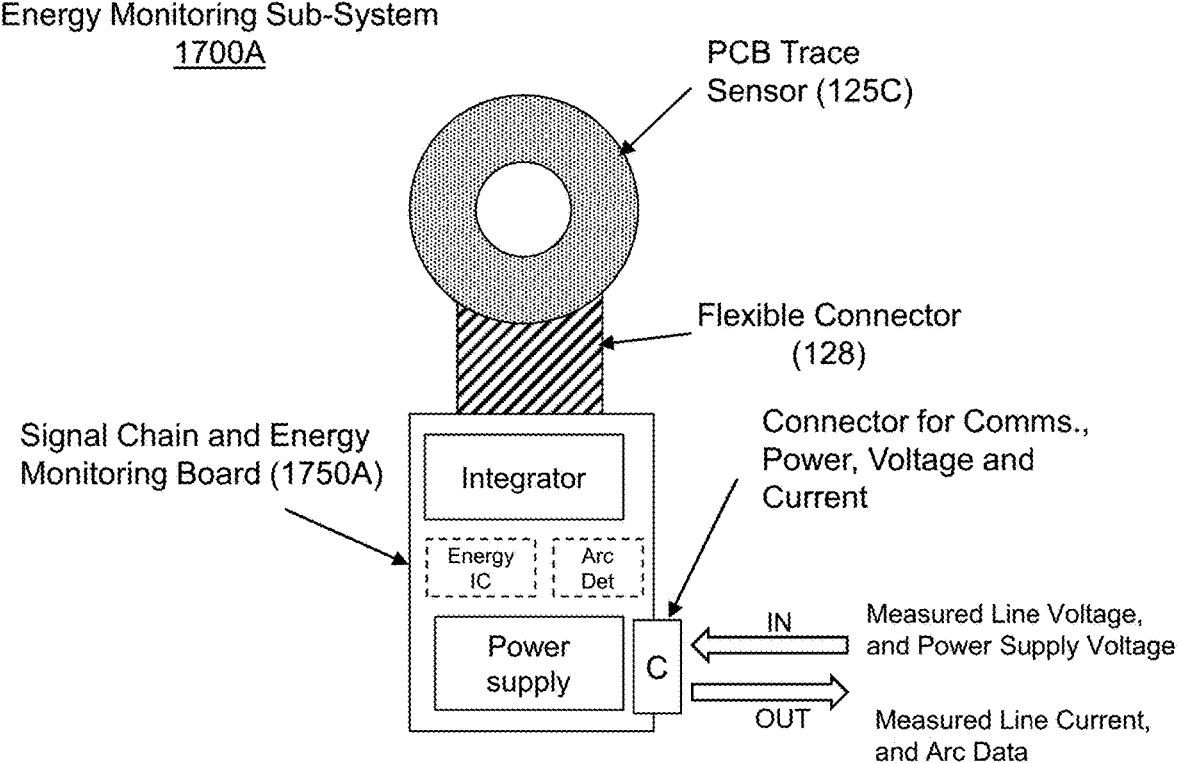
FIG. 17A shows an example energy monitoring subsystem using a PCB Trace Sensor with a flexible connector for connecting to other electronic/electrical component(s), such as a signal conditioner and signal processing circuit(s), on another PCB substrate according to embodiments of the present disclosure.

FIG. 17A shows an example energy monitoring subsystem 1700A using a PCB trace sensor with a flexible connector for connecting to other electronic/electrical component(s) on another PCB substrate according to embodiments of the present disclosure. The energy monitoring subsystem 1700A can be employed to monitor energy-related signals (e.g., current or voltage) on a conductor, such as for example in the current flow monitoring device 100, breaker or other devices described herein.

The energy monitoring subsystem 1700A can be a PCB module that includes a first PCB sub-module and a second PCB sub-module, which are connected across a flexible connector 128. The first PCB sub-module can include PCB trace sensor 125C. The second PCB sub-module can be a signal chain and energy monitoring board 1750A, which can include a separate PCB section/substrate, having various electronic/electrical components. The electronic/electrical component(s) can include a signal conditioning circuit (e.g., a signal integrator, etc.), a power supply circuit, and a connector (or connector interface) C for connecting to other electronic/components in the monitoring device. The board 1750 also can include signal processing circuits, such as energy measurement/calculation circuit (e.g., Energy Integrated Circuit (IC)) and arc fault detection circuit (e.g., Arc Det.). The connector C can be used to receive as input measured line voltage and power supply voltage from which the power supply circuit can supply power to various electronic/electrical components of the board 1750A, and to output measured line current and arc fault data to other remote electronic/electrical component(s) of the current flow monitoring device such as a main controller (e.g., MCU or CPU) of the monitoring device for further processing and action. The further processing and action can, for example, include tripping the breaker, generating an alarm, reporting measurements and/or other relevant information, and so forth.

In various embodiments, the energy monitoring subsystem 1700A can be employed to measure energy-related signals, e.g., current or voltage, on a conductor using the PCB trace sensor 125C in a 1-pole monitoring device, such as a 1-pole breaker, and process measurement signals from the sensor as described herein. In various embodiments, a plurality of energy monitoring subsystems 1700A can be employed to measure energy-related signals (e.g., current or voltage) on a plurality of conductors using a plurality of PCB trace sensors 125C in a multi-pole current flow monitoring device, such as a 2-pole breaker, and to process the measurement signals from corresponding sensors.

Figure 20A:
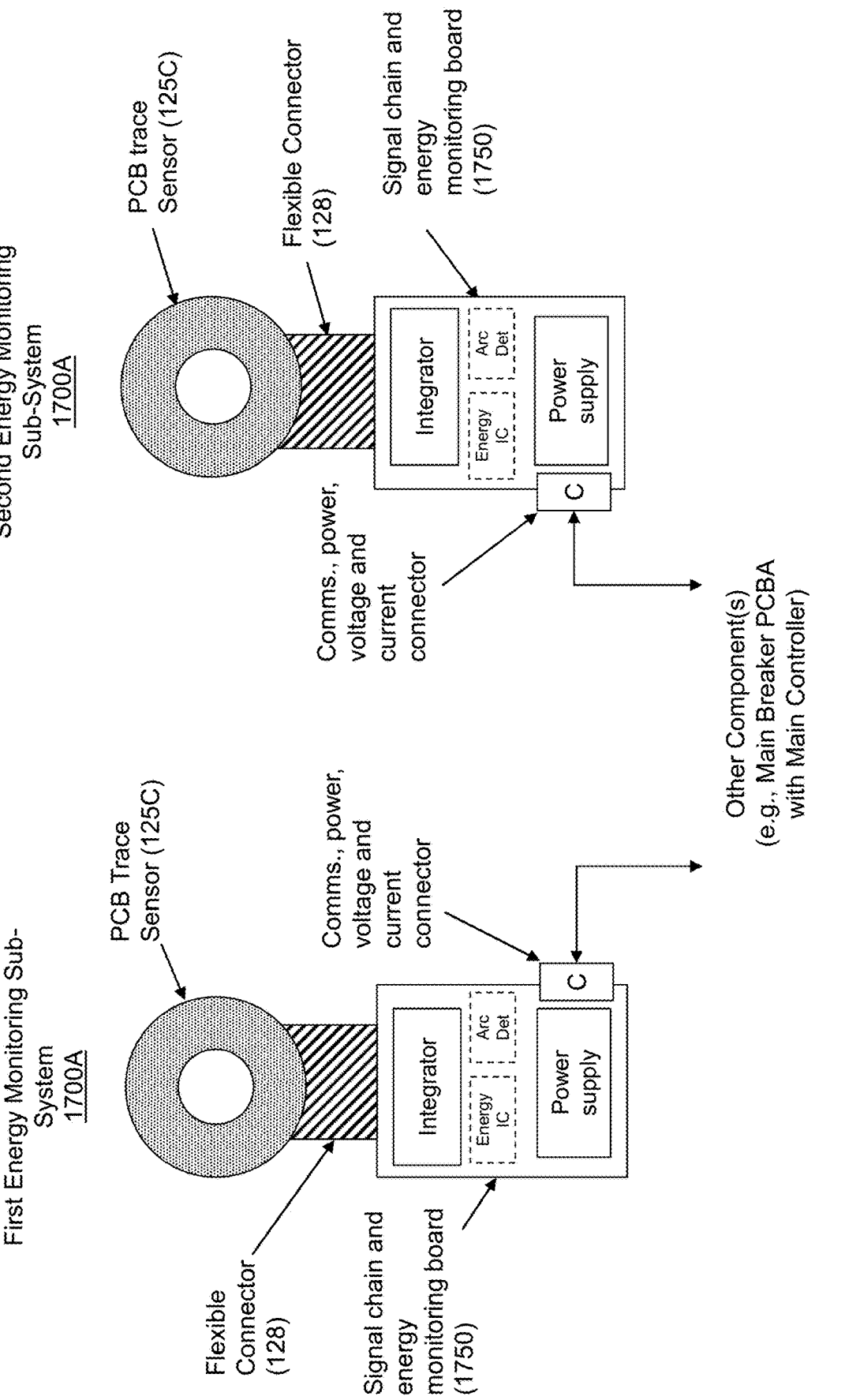
FIG. 20A shows an example of a plurality of energy monitoring subsystems of FIG. 17A for monitoring a plurality of conductors such as in a multi-pole current flow monitoring device with a plurality of line conductors to be monitored, according to embodiments of the present disclosure.

An example of first and second energy monitoring subsystems 1700A are shown in the example of FIG. 20A for a 2-pole current flow monitoring device, such as a 2-pole miniature circuit breaker. In the example of FIG. 20, each subsystem 1700A can be used to monitor and process measurements of energy-related signals (e.g., current or voltage) for respective line conductors (e.g., Line 1 and Line 2).

Figure 20B:
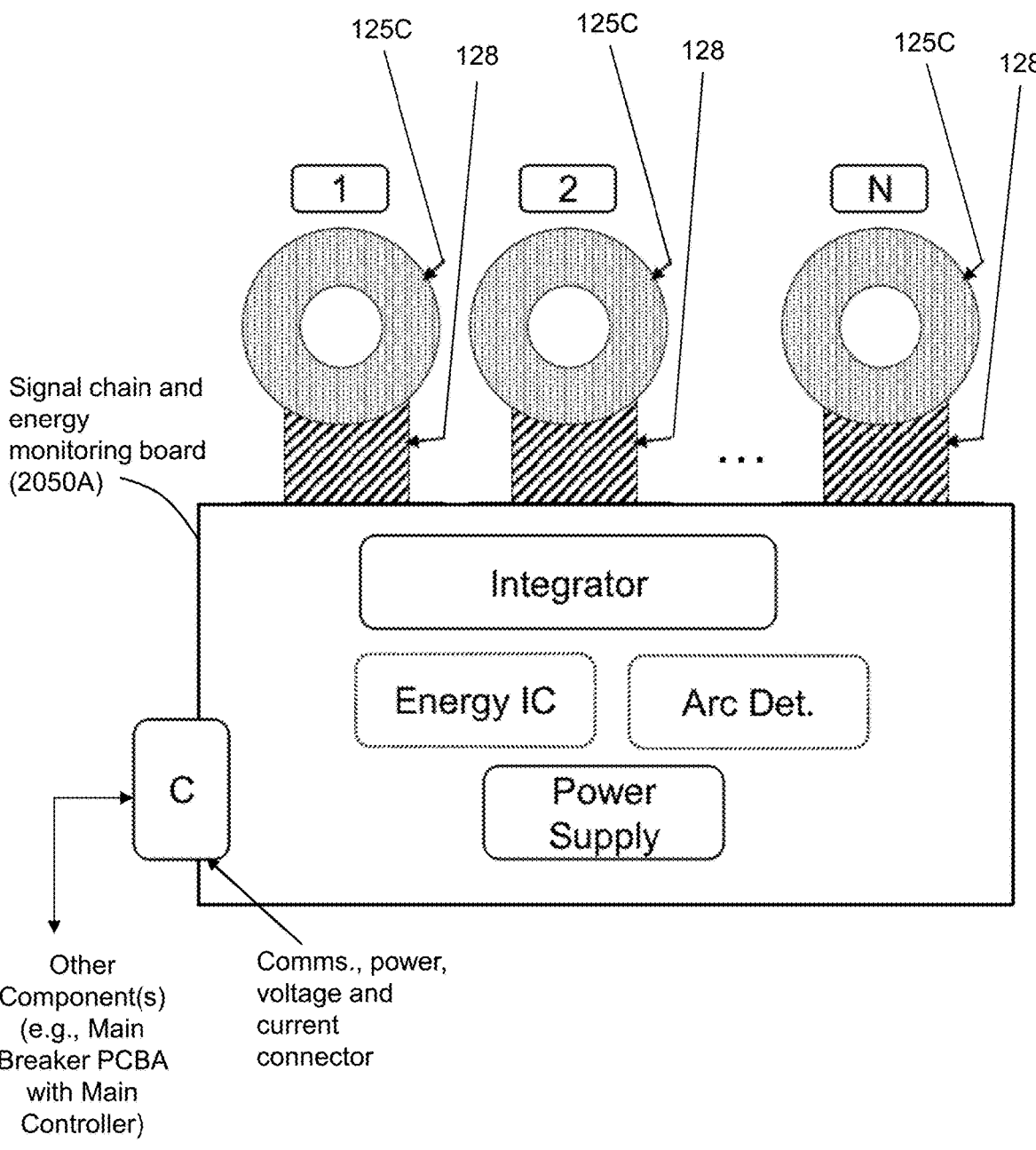
FIG. 20B shows an example of an energy monitoring subsystem with a plurality of PCB Trace Sensors and associated flexible connectors for monitoring a plurality of conductors such as in a multi-pole current flow monitoring device with a plurality of line conductors to be monitored, according to embodiments of the present disclosure.
Figure 20C:
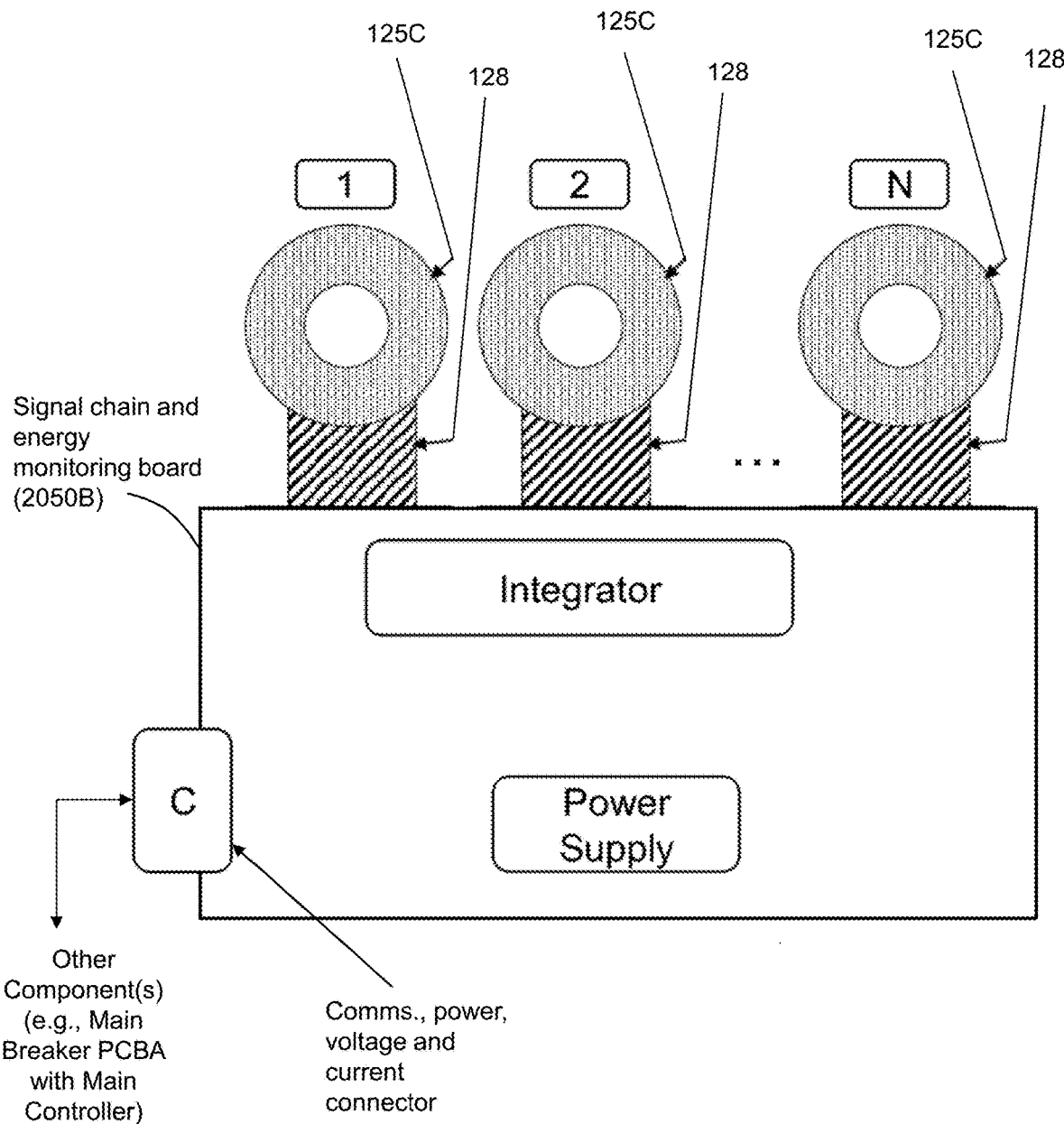
FIG. 20C shows an example of an energy monitoring subsystem with a plurality of PCB Trace Sensors and associated flexible connectors for monitoring a plurality of conductors such as in a multi-pole current flow monitoring device with a plurality of line conductors to be monitored, according to embodiments of the present disclosure.

Alternatively, in such multi-pole devices with multiple conductors to monitor, such devices can employ an energy monitoring subsystem 2000A of FIG. 20B with a plurality of PCB current trace sensors connected to a single, separate PCB substrate 2050A having electronic/electrical components, across respective flexible connectors. The electronic/electrical component(s) can include a signal conditioning circuit (e.g., a signal integrator, etc.), a power supply circuit, and a connector (or connector interface) C for connecting to other electronic/components in the monitoring device. The board 2050A also can include signal processing circuits, such as energy measurement/calculation circuit (e.g., Energy Integrated Circuit (IC)) and arc fault detection circuit (e.g., Arc Det.) for each monitored conductor or a combination thereof. The connector C can be used to receive as input measured line voltages and power supply voltage from which the power supply circuit can supply power to various electronic/electrical components of the board 2050A, and to output measured line currents and arc fault data to other remote electronic/electrical component(s) of the current flow monitoring device such as a main controller (e.g., MCU or CPU) of the monitoring device for further processing and action. The further processing and action can, for example, include tripping the breaker, generating an alarm, reporting measurements and/or other relevant information, and so forth.

Figure 17B:
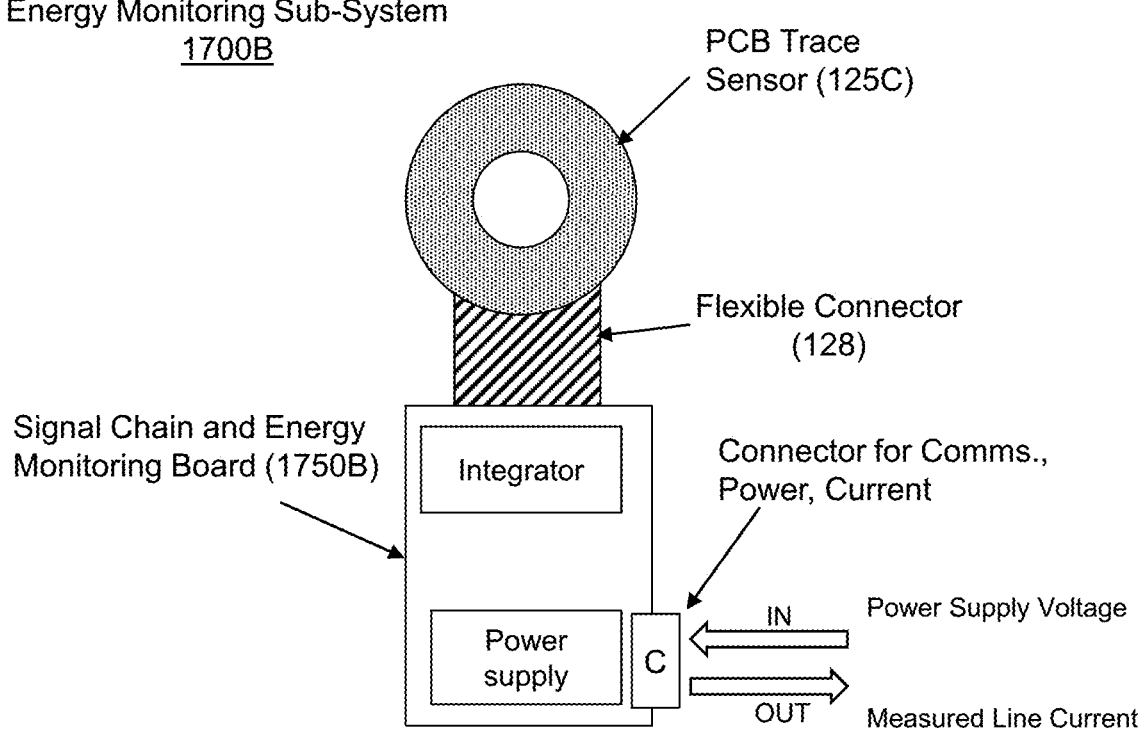
FIG. 17B shows an example energy monitoring subsystem using a PCB Trace Sensor with a flexible connector for connecting to other electronic/electrical component(s) on another PCB substrate according to embodiments of the present disclosure.

FIG. 17B shows an example energy monitoring subsystem 1700B using a PCB trace sensor with a flexible connector for connecting to other electronic/electrical component(s) on another PCB substrate according to embodiments of the present disclosure. The energy monitoring subsystem is basically the same as the subsystem 1700A of FIG. 17A, except that the signal chain and energy monitoring board 1750B can simply include a signal conditioning circuit (e.g., integrator, etc.), a power supply circuit, and a connector (or connector interface) C.

In this example, the energy monitoring subsystem 1700B can be employed to monitor energy-related signals (e.g., current or voltage) on a conductor, such as for example in the current flow monitoring device 100, breaker or other devices described herein. The monitored signals can be provided to an energy measurement integrated circuit (IC) or other circuit, for signal processing.

The energy monitoring subsystem 1700B can be employed to measure energy-related signals (e.g., current or voltage) on a conductor in a one-pole, two-pole or multi-pole current flow monitoring device. In various embodiments, the energy monitoring subsystem 1700B can provide a retro-fit solution for current flow monitoring devices with separate energy measurement IC or other signal processing circuit.

A plurality of such energy monitoring subsystems 1700B can be employed to monitor the plurality of line conductors in a multi-pole monitoring device. Alternatively, in other embodiments, in such multi-pole devices with multiple conductors to monitor, the devices can employ an energy monitoring subsystem 2000B of FIG. 20C with a plurality of PCB current trace sensors connected to a single, separate PCB substrate 2050B having electronic/electrical components, across respective flexible connectors. The electronic/electrical component(s) can include a signal conditioning circuit (e.g., a signal integrator, etc.), a power supply circuit, and a connector (or connector interface) C for connecting to other electronic/components in the monitoring device. The connector C can be used to receive as input power supply voltage from which the power supply circuit can supply power to various electronic/electrical components of the board 2050B, and to output measured line currents to other remote electronic/electrical component(s) of the current flow monitoring device such as an energy measurement integrated circuit(s) (IC(s)) or a main controller (e.g., MCU or CPU) of the monitoring device for further processing and action. The further processing and action can, for example, include measuring/calculating energy usage, performing arc fault detection, tripping the breaker, generating an alarm, reporting measurements and/or other relevant information, and so forth.

Figure 18:
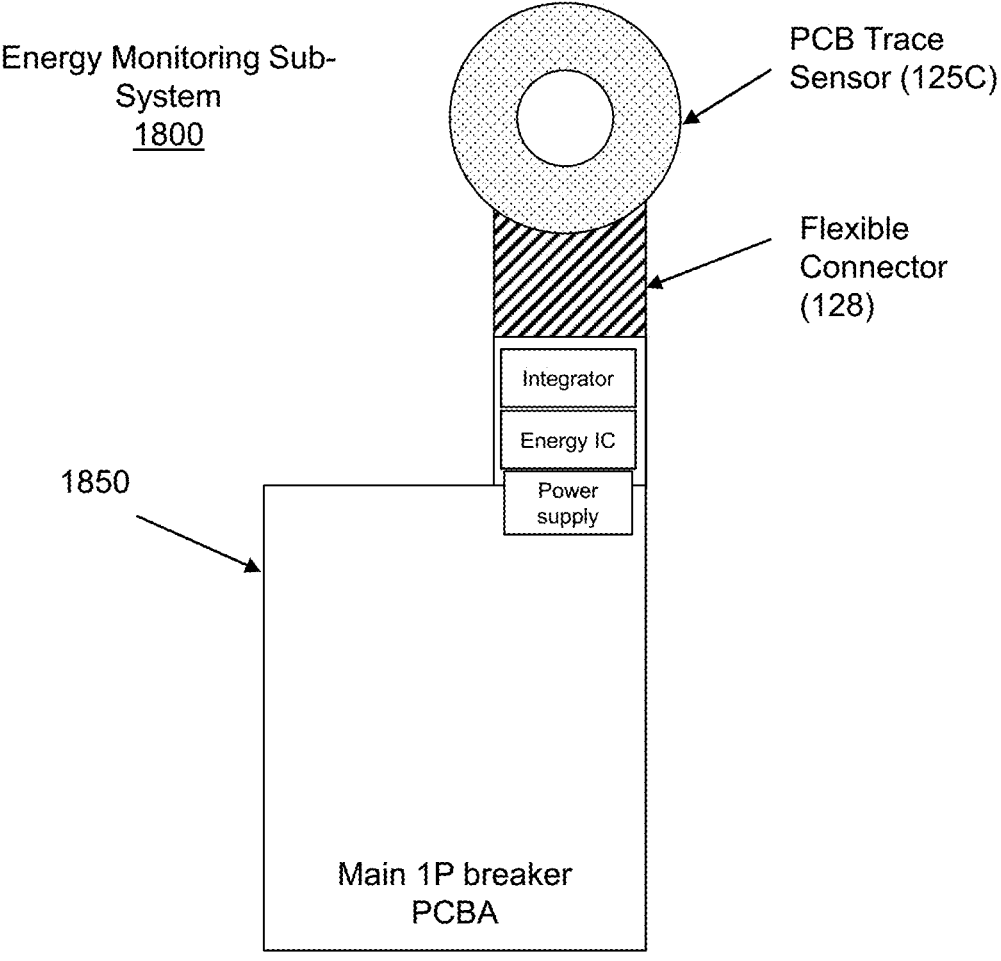
FIG. 18 shows an example energy monitoring subsystem using a PCB Trace Sensor with a flexible connector for connecting to other electronic/electrical component(s) on another PCB substrate according to other embodiments of the present disclosure.

FIG. 18 shows an example energy monitoring subsystem 1800 using a PCB Trace Sensor with a flexible connector for connecting to other PCB section/substrate having electronic/electrical component(s) according to other embodiments of the present disclosure.

The energy monitoring subsystem 1800 can be a PCB module that includes a first PCB sub-module and a second PCB sub-module, which are connected across a flexible connector 128. The first PCB sub-module can include PCB trace sensor 125C. The second PCB sub-module can be a main breaker PCBA including a signal chain and energy monitoring board 1850, which can include a separate PCB section/substrate, having various electronic/electrical components including a signal conditioning circuit (e.g., an integrator), a signal processing circuit such as an energy measurement integrated circuit (IC), and a power supply circuit. The main breaker PCBA also can include other electronic/electrical components including a main controller (e.g., MCU or CPU) for controlling the operations of the various components of the monitoring device.

In various embodiments, the energy monitoring subsystem 1800 can be integrated into the main PCBA for a 1-pole (IP) miniature circuit breaker (MCB). For multi-pole device applications, the energy monitoring sub-system 1800 can incorporate additional PCB trace sensors (e.g., 125C), which may be connected to the main PCBA, across a respective flexible connector. The main PCBA can include electronic/electrical components for performing signal conditioning and signal processing of output signals from the plurality of sensors.

Figure 19:
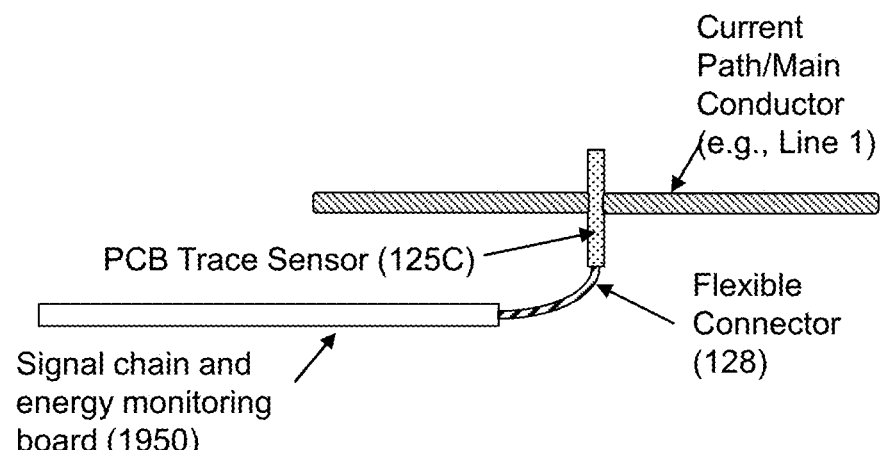
FIG. 19 shows an example side view of an energy monitoring subsystem using a PCB Trace Sensor with a flexible connector for connecting to other electronic/electrical component(s) on another PCB according to embodiments of the present disclosure.

FIG. 19 shows an example side view of an energy monitoring subsystem 1900, which includes a PCB trace sensor with a flexible connector for connecting to other electronic/electrical component(s) on another PCB section/substrate, according to embodiments of the present disclosure. The energy monitoring sub-system 1900 can include a first PCB sub-module, a second PCB sub-module, and a flexible connector 128 for connecting the first and second PCB sub-modules (or components thereof). The first PCB sub-module can include the PCB trace sensor 125C. The second PCB sub-module can be a separate PCB section/substrate such as for example a signal chain and energy monitoring board 1950. The board 1950 can be a main breaker PCBA, or other printed circuit board as described herein.

As shown in FIG. 19, the PCB trace sensor 125C can be arranged in a current flow monitoring device to measure energy-related signals on a conductor. The flexible connector 128 can be adjustably bent to position the PCB trace sensor 125 and board 1950 in a case or housing of a current flow monitoring device.

Figure 21A:
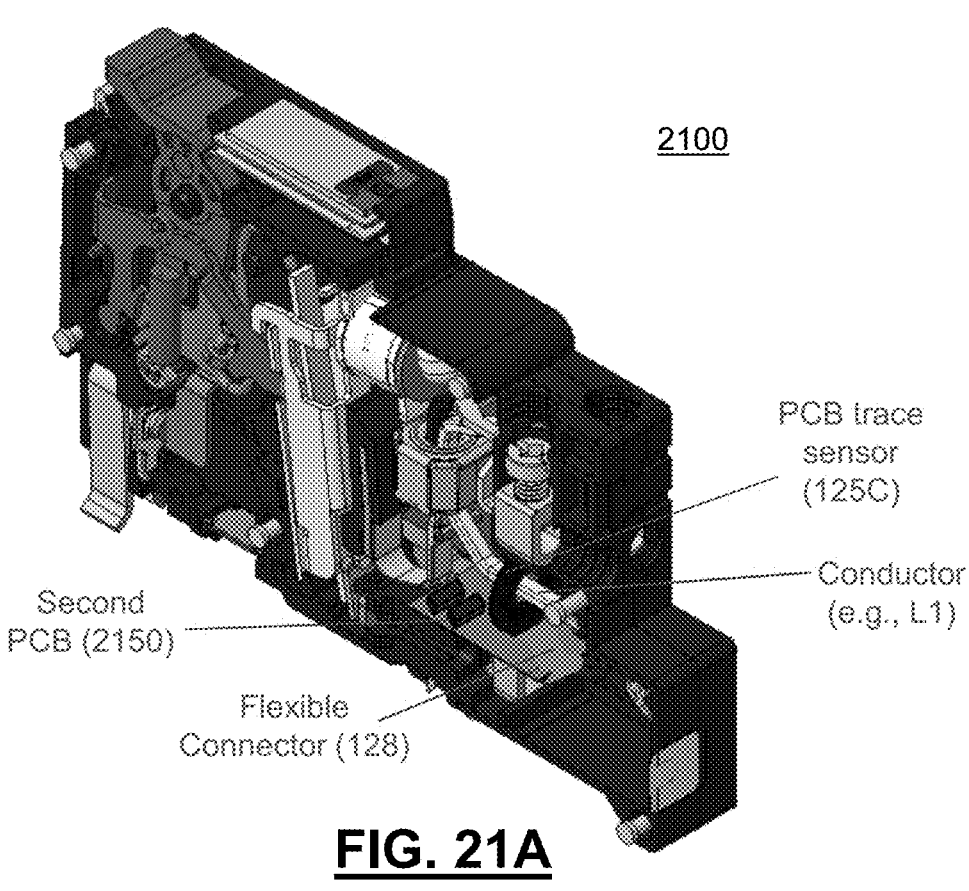
FIGS. 21A, 21B and 21C show different views of an exemplary current flow monitoring device, such as a miniature circuit breaker (MCB), including the energy monitoring system/subsystem of FIG. 15, FIG. 16, FIGS. 17A and 17B, or FIG. 18, according to embodiments of the present disclosure.
Figure 21B:
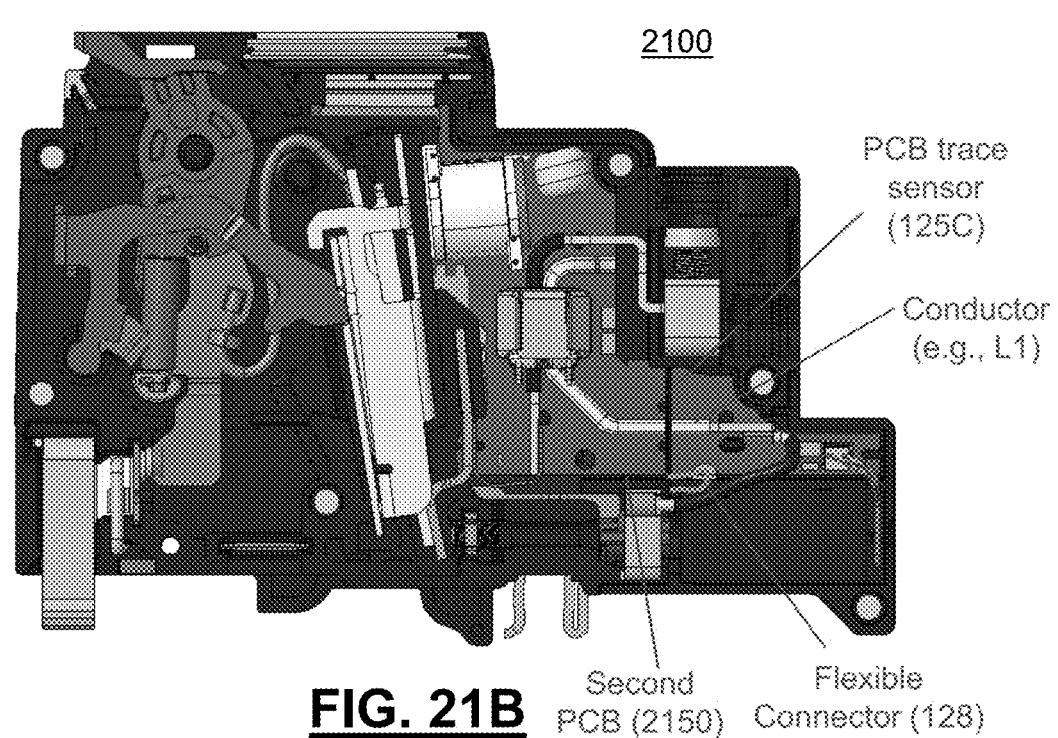
Figure 21C:
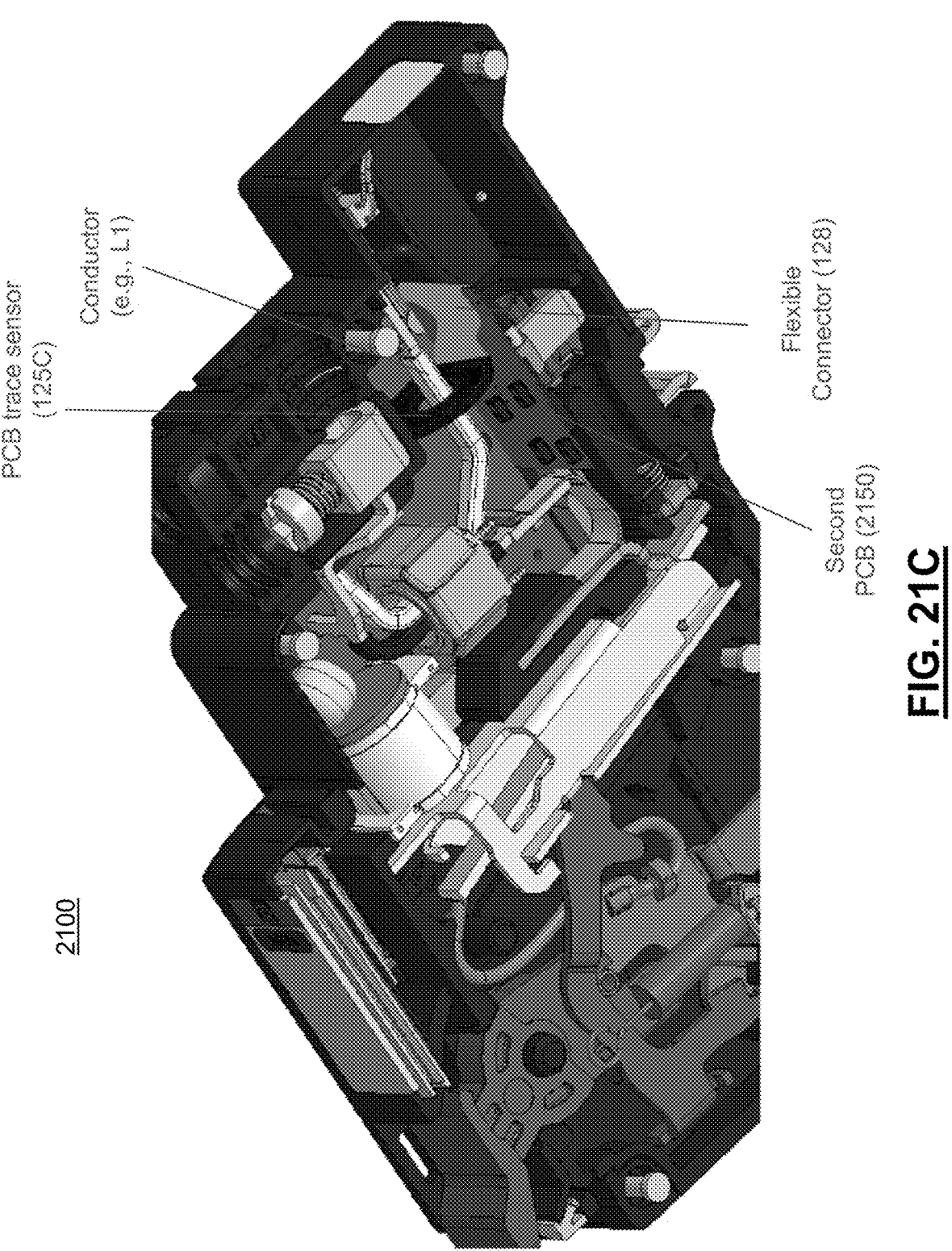

FIGS. 21A, 21B and 21C show different views of an exemplary current flow monitoring device 2100, such as a miniature circuit breaker (MCB), which can include an energy monitoring PCB module or subsystem of FIG. 15, 16, 17A and 17B, or 18, according to embodiments of the present disclosure. As shown in these figures, the device 2100 can include an energy monitoring subsystem for monitoring and analyzing energy-related signals, such as for example current, on a conductor, such as Line 1 of a 1-pole circuit breaker. In this example, the energy monitoring PCB module can include at least two PCB sub-modules, e.g., first and second PCB sub-modules, which are connected across a flexible connector for enabling communications of signals (or data) therebetween. The first PCB sub-module can include a PCB trace sensor 125C for measuring current on a conductor. The second PCB sub-module can include a PCBA 2150 having various electronic/electrical components (e.g., circuits including IC chips, etc.) on a PCB section/substrate separate from the PCB trace sensor 125C. The PCBA 2150 can include various circuits, such as signal conditioning circuit(s) (e.g., integrator(s), amplifier(s), filter(s), etc.), signal processing circuit(s) such as energy measurement/calculation circuit and arc fault detection circuit, and other electronic/electrical components such as a connector/connector interface for communicating with a remote device or component and a power supply circuit for supplying power to the various electrical components of the PCBA 2150, and so forth. In various embodiments, the PCBA 2150 can be the main PCBA of the breaker, which can include the main controller (e.g., MCU or CPU) of the breaker for controlling various components of the breaker and performing/controlling various operations of the breaker.

Figure 22:
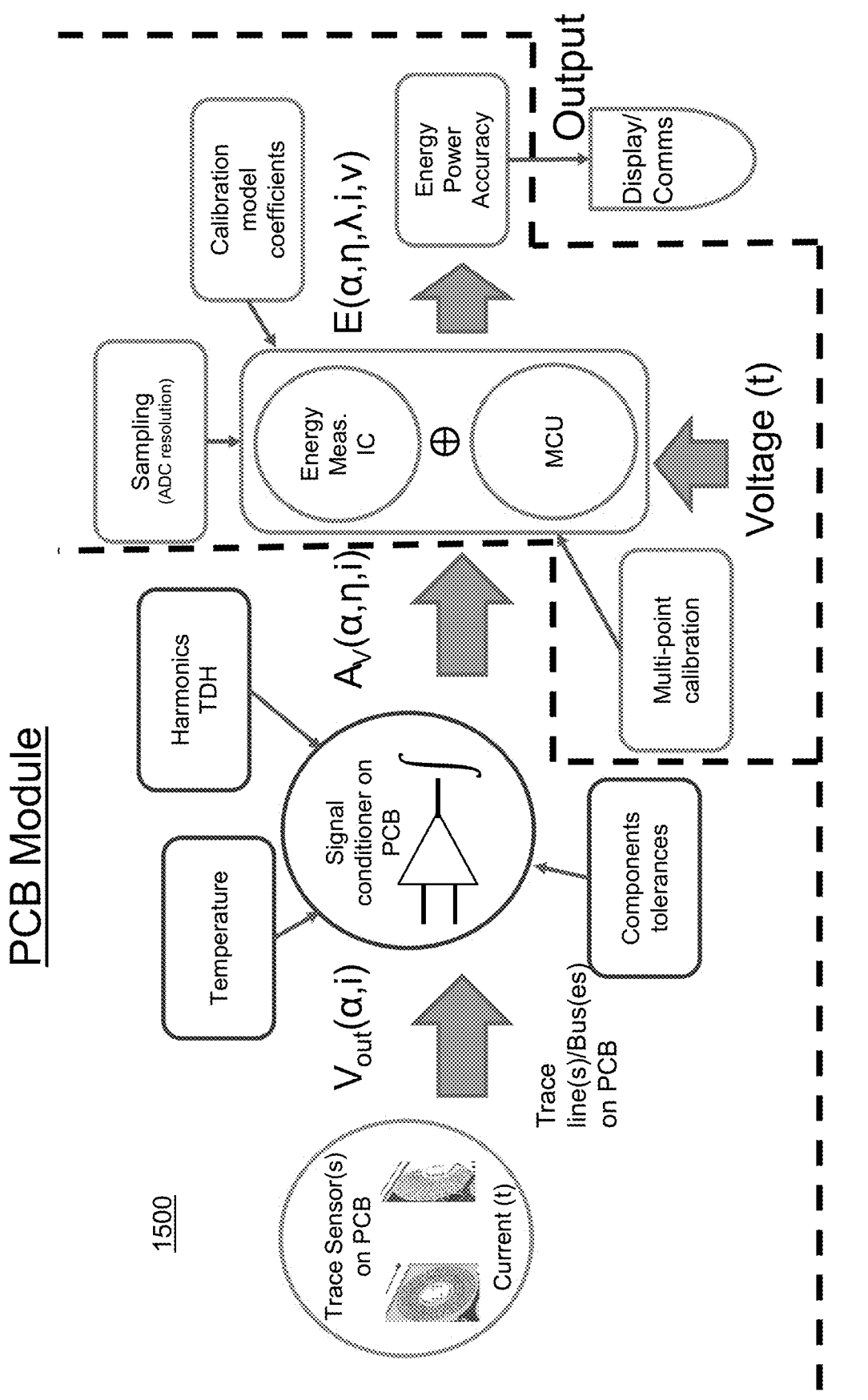
FIG. 22 shows a block diagram of an exemplary architecture for energy monitoring using current sensor according to embodiments of the present disclosure.

FIG. 22 shows a block diagram 2200 of an exemplary architecture for energy measurement/calculation and energy monitoring using a current sensor and current measurements from the current sensor according to embodiments of the present disclosure.

Various examples of PCB trace current sensor or current sensor trace designs as described herein are shown and described below with reference to the examples of FIG. 23 through FIG. 27. Although these trace current sensor examples are shown as a PCB sensor unit, one or more trace current sensors can be formed on the PCB substrate of current sensor/energy measurement PCB module as discussed herein and can be connected to other components of the PCB module, such as signal processing front-end or its signal conditioner, using connectors which are embedded in the PCB substrate (e.g., conductive traces, etc.).

Figure 23:
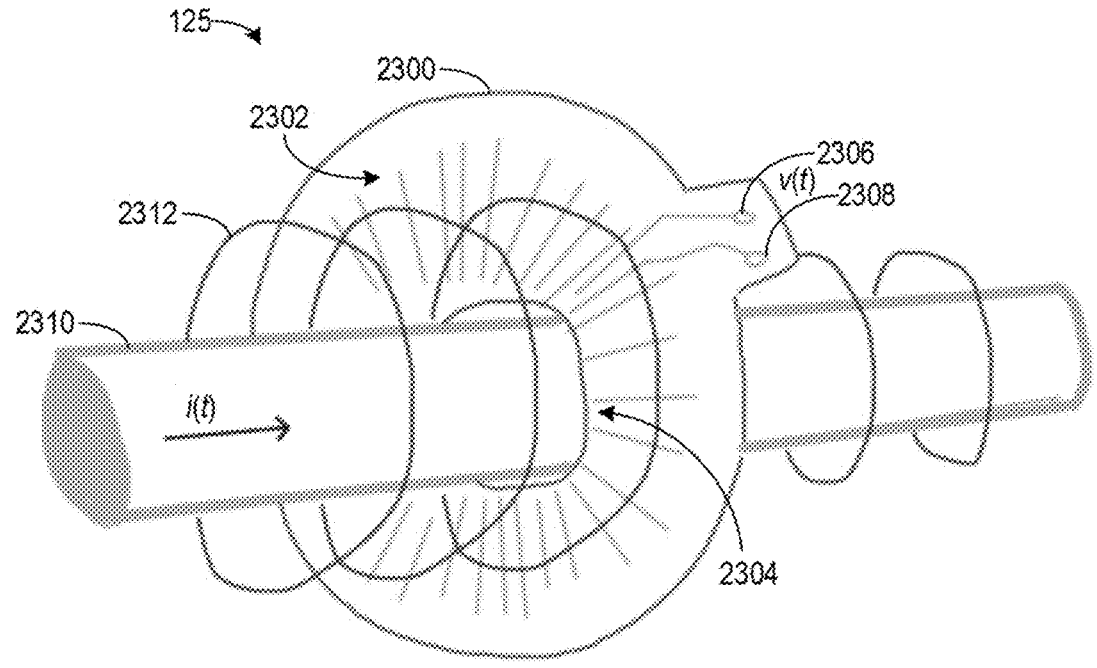
FIG. 23 shows a conceptual diagram illustrating operation of an exemplary PCB trace current sensor according to embodiments of the present disclosure.

FIG. 23 is a conceptual diagram showing operation of the PCB trace current sensor 125 according to embodiments of the present disclosure. As this figure illustrates, the PCB trace current sensor 125 is formed on a PCB substrate 2300 having a plurality of elongate conductive traces 2302 formed therein and extending generally radially outward from a central opening or hole 2304 in the PCB substrate 2300. As will be explained later herein, the elongate conductive traces 2302 are connected to one another by vias to form a conductive helix in the shape of a circle or a polygon that surrounds the central opening 2304 in the PCB substrate 2300 that resembles a Rogowski coil. Lead terminals 2306, 2308 for the Rogowski coil may then be formed by omitting any given via and connecting circuit leads to the open-ended traces. In various embodiments, the lead terminals 2306, 2308 can be connected to other components on the PCB substrate 2300, which may take a different form than that shown in FIG. 23, using embedded connectors on the PCB substrate.

In general operation, as understood in the art, an alternating current i(t) flowing in a conductor 2310 running through the opening 2304 in the PCB trace current sensor 125 induces an alternating magnetic field, indicated at 2312, around the conductor 2310. The alternating magnetic field 2312 in turn induces an alternating voltage v(t) in the conductive traces 2302 that is proportional to the current i(t) in the conductor 2310. The alternating voltage v(t) can then be sampled and measured at the terminals 2306, 2308 to monitor the current flowing through the conductor 2310.

Figure 24A:
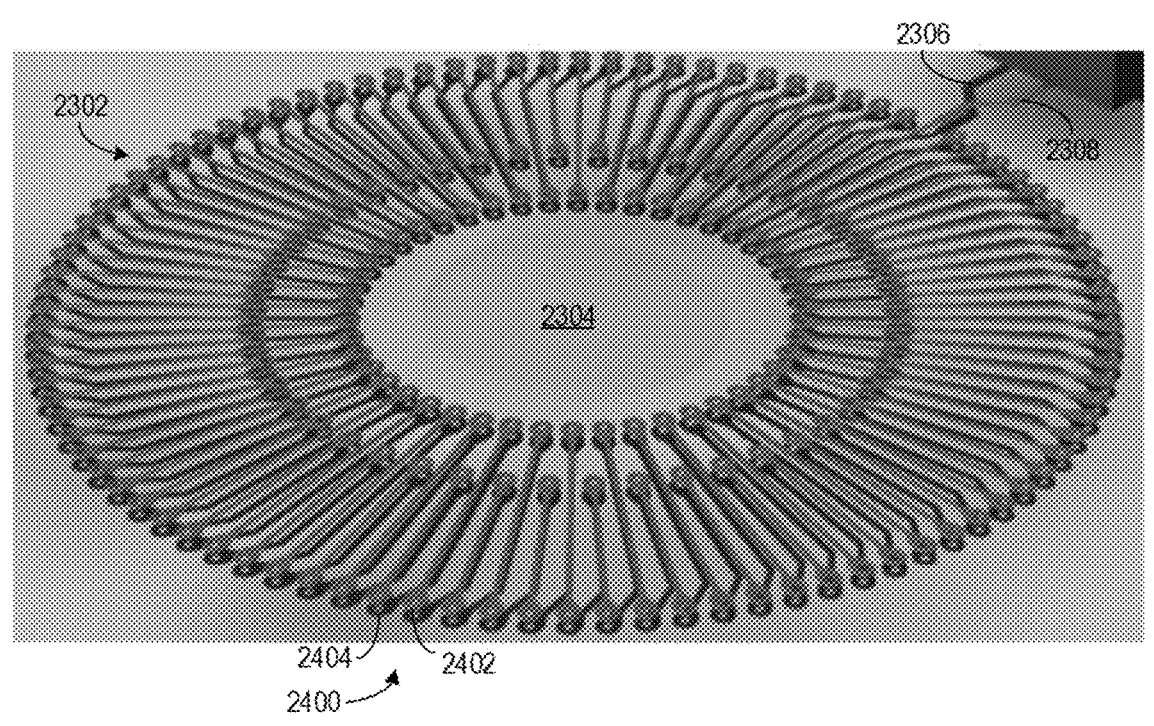
FIGS. 24A and 24B show perspective views illustrating exemplary conductive traces for a PCB trace current sensor according to embodiments of the present disclosure.
Figure 24B:
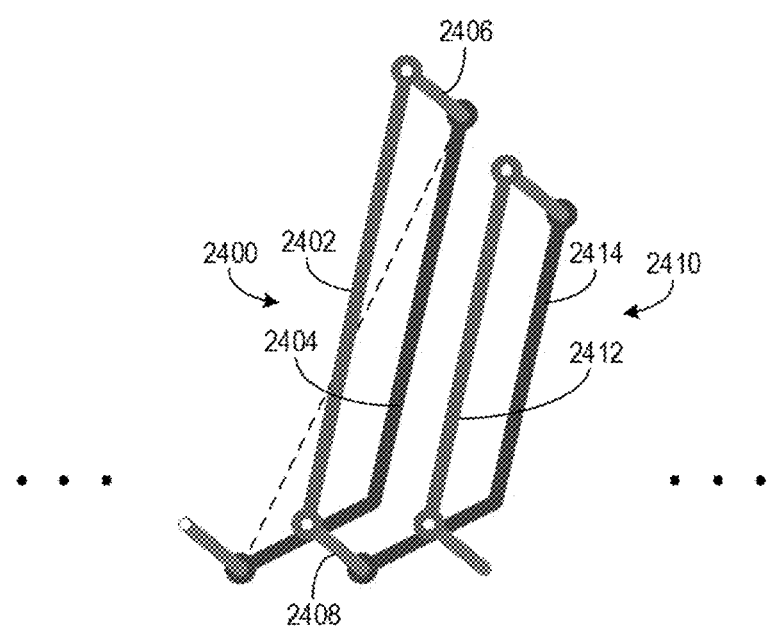

FIGS. 24A and 24B show perspective views illustrating the elongate conductive traces 2302 of the PCB trace current sensor 125 in more detail according to embodiments of the present disclosure. In these views, the PCB substrate 2300 from FIG. 23 has been omitted for better viewing of the plurality of elongate traces 2302.

Referring first to FIG. 24A, in some embodiments, the plurality of traces 2302 are arranged in pairs such that each pair forms one of the coil windings of the PCB trace current sensor 125. Multiple pairs of conductive traces may then be connected together by electrically conductive vias to form the coil windings for the PCB trace current sensor 125. An exemplary pair of traces is generally indicated at 2400 and includes a top side trace 2402 and a bottom side trace 2404 formed directly opposite one another on the PCB substrate (not shown here). The traces 2402, 2404 in the pair of traces 2400 extend radially outward from the central opening 2404 in the PCB substrate to form a coil winding.

FIG. 24B shows a close-up view of the pair of traces 2400. An adjacent pair of traces 2410 composed of a top side trace 2412 and a bottom side trace 2414 is also shown here. The traces 2412, 2414 of the adjacent pair of traces 2410 are formed directly opposite one another on the PCB substrate (not shown here) and also extend radially outward from the central opening 2304 in the PCB substrate. To accommodate the radially outward extension, in some embodiments, the pair of traces 2400 and the adjacent pair of traces 2410 may have different overall lengths. For example, the pair of traces 2400 may have a longer overall length compared to the adjacent pair of traces 2410, or vice versa. This arrangement avoids overcrowding of the traces 2402 on the PCB substrate near the central opening 2304, thereby allowing a greater number of traces to be used for the PCB trace current sensor 125. It will be understood that trace overcrowding is not a prerequisite for using pairs of traces that have different overall lengths, and that such traces may be used regardless of the number of coil windings in the PCB trace current sensor (i.e., even when there is no overcrowding of the traces).

As can be seen in FIG. 24B, each trace 2402, 2404 and 2412, 2414 in the pairs of traces 2400, 2410 is connected to vias, one via at each end of each trace. For example, a via 506 at one end of the top trace 2402 connects that trace to its bottom trace 2404 in the pair of traces 2400, while another via 2408 at the other end of the top trace 2402 connects the trace to the bottom trace 2414 in the adjacent pair of traces 2410. To facilitate the latter connection, the bottom or opposite trace in each pair of traces may run at an angle, as indicated by the dashed line, or have a segment that angles, toward the bottom or opposite trace in an adjacent pair of traces. The above trace-to-trace connection pattern is repeated for each pair of traces and adjacent pair of traces in the plurality of traces 2302 until the traces are connected to one another. The result is a conductive helix in the shape of a circle or a polygon that surrounds the central opening 2304 in the PCB substrate that resembles a Rogowski coil. Lead terminals 2306, 2308 for the PCB trace current sensor 125 may then be formed by omitting the via at one end of a given pair of traces and connecting circuit leads to the open-ended traces.

Figure 25:
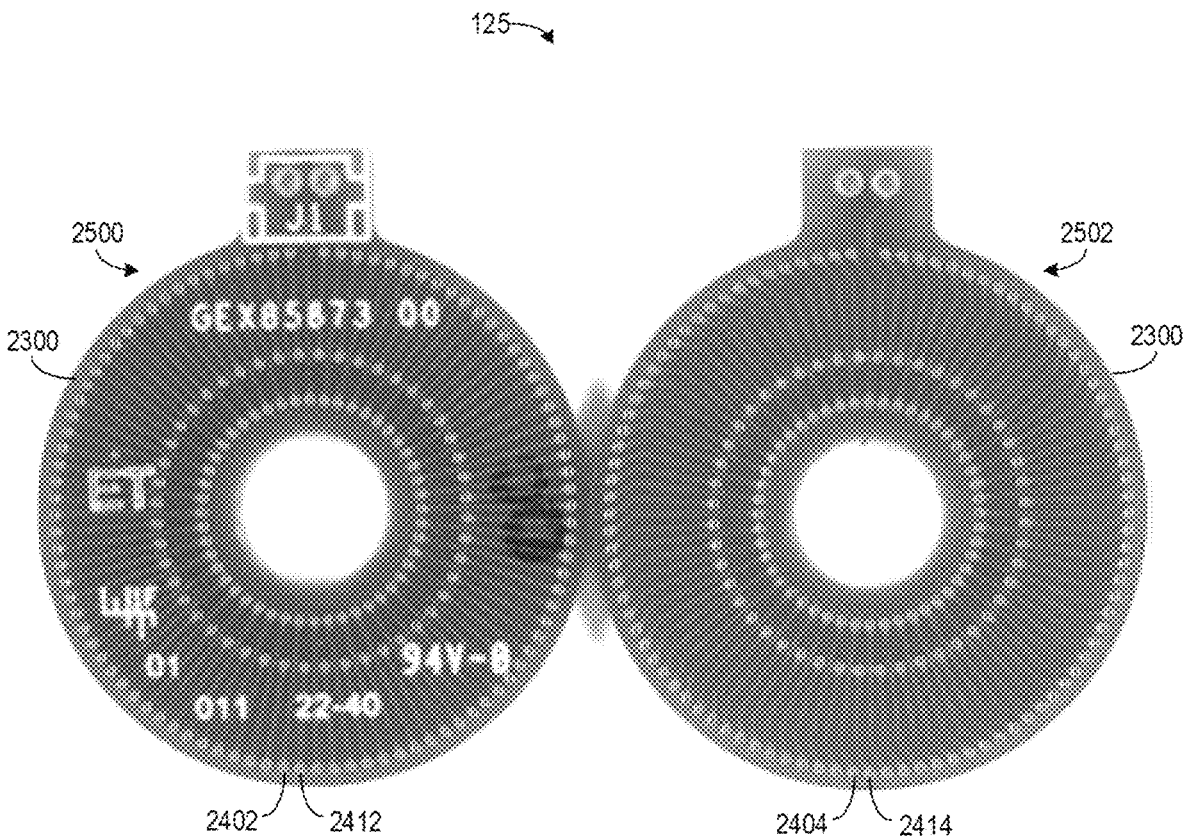
FIG. 25 shows top side and bottom side views of an exemplary PCB trace current sensor according to embodiments of the present disclosure.

FIG. 25 shows top side and bottom side views of the PCB trace current sensor 125 according to embodiments of the present disclosure. As this figure shows, the PCB substrate 2300 of the PCB trace current sensor 125 has a top side 2500 and a bottom side 2502. The top side 2500 in this embodiment has top side traces that resemble the top side traces 2402, 2412 from FIGS. 24A and 24B in that the traces have no angled segments. In contrast, the bottom side 2502 in this embodiment has bottom side traces that all resemble the bottom side traces 2404, 2414 from FIGS. 24A and 24B in that they each have an angled segment.

Figure 26A:
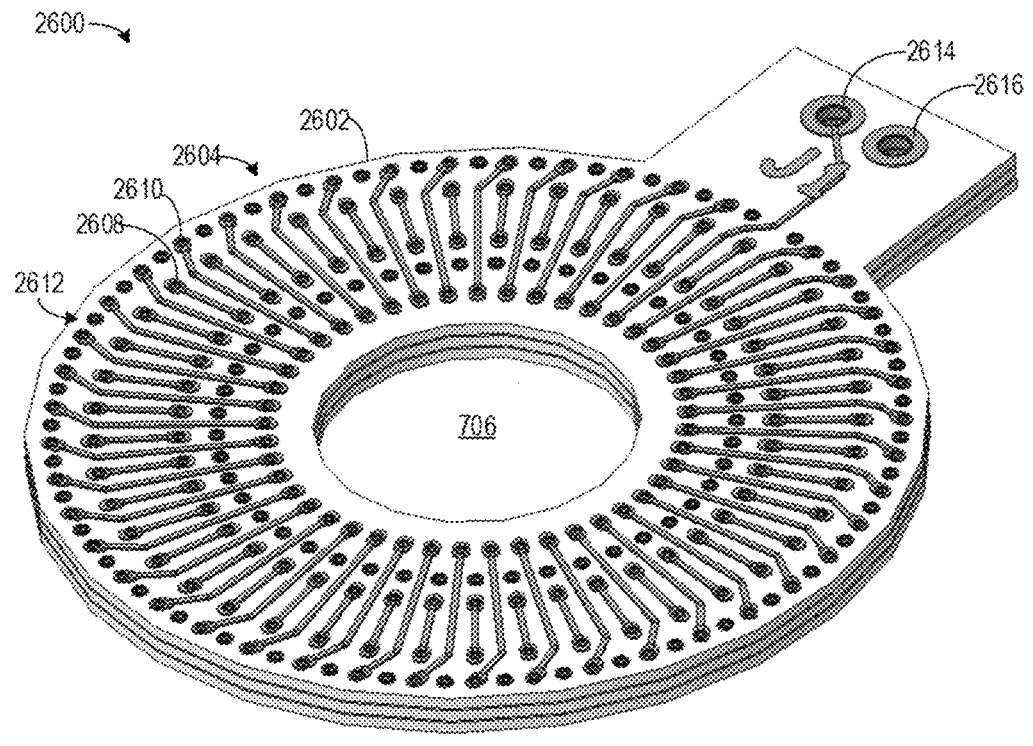
FIGS. 26A and 26B show perspective views of an exemplary PCB trace current sensor having a multi-layer coil according to embodiments of the present disclosure.
Figure 26B:
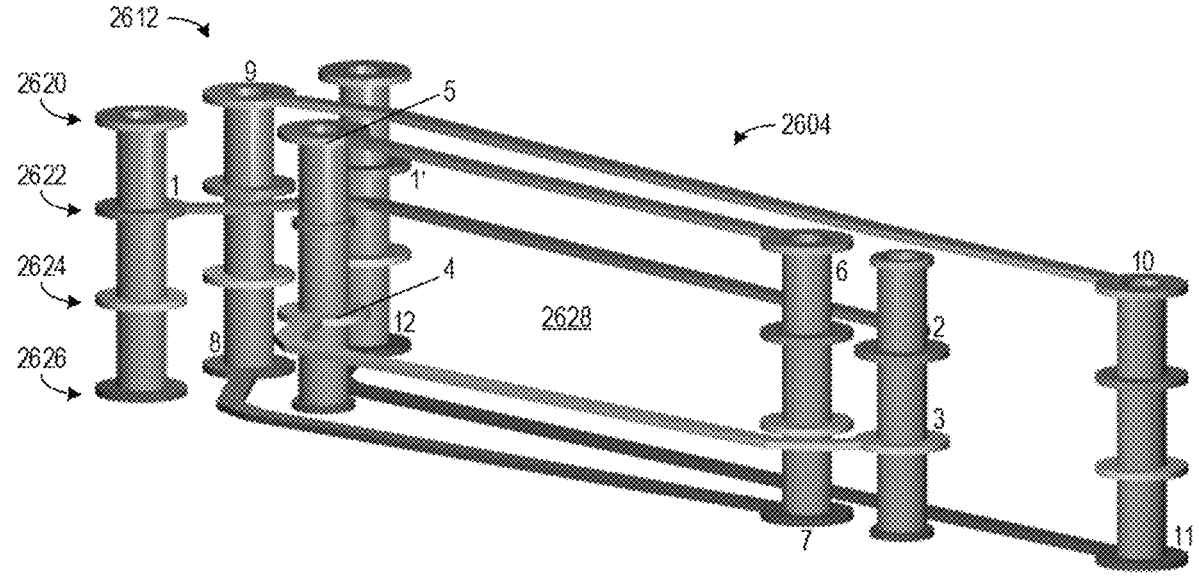

FIGS. 26A and 26B are perspective views showing another PCB trace current sensor 2600 according to alternative embodiments of the present disclosure in which the coil windings of the Rogowski coil is formed using additional PCB substrate layers. Referring first to FIG. 26A, the PCB trace current sensor 2600 in this example is similar to the PCB trace current sensors discussed previously insofar as there is a generally circular PCB substrate 2602 having a plurality of elongate conductive traces 2604 formed on a top layer and extending generally radially outward from a central opening or hole 2606 in the PCB substrate 2602. The top layer of the PCB substrate 1902 in this embodiment may have both traces 2608 with no angled segments and traces 2610 with angled segments, arranged in an alternating fashion. Additionally, although not visible here, the PCB substrate 2602 may also have one or more internal layers in addition to a bottom layer, each layer having a conductive trace 2604 formed thereon and arranged to form the coil windings of the PCB trace current sensor 2600. A plurality of vias 2612 may then be provided to connect the traces 1904 together to form the coil windings for the PCB trace current sensor 2600. Lead terminals 2614, 2616 for the PCB trace current sensor 2600 may be formed by omitting the via at one end of a given pair of traces and connecting circuit leads to the open-ended traces.

FIG. 26B is a partial perspective view showing some of the conductive traces 2604 and vias 2612 arranged on the one or more internal layers mentioned above to form a multi-layer coil winding, but with the PCB substrate 2602 omitted for ease of viewing. As can be seen, the PCB substrate 2602 in this example has four layers, a top layer 2620, two internal layers 2622 and 2624, and a bottom layer 2626. The conductive traces 2604 on each layer 2620, 2622, 2624, and 2626 may then be connected together by the vias 2612, as shown, to form a multi-layer coil winding, indicated at 2628, for the PCB trace current sensor 2600. In this example, the multi-layer coil winding 2628 starts at point 1 located on internal layer 2622 (purple trace), continues toward point 2 on the same layer, then proceeds by means of one of the vias 2612 to point 3 on another internal layer 2624 (yellow trace), then to point 4 on the same internal layer. Points 1-4 form one turn of the coil winding 2628. From point 4, the coil winding 2628 proceeds to point 5 on the top layer 2620 (green trace) through another one of the vias 2612 and continues to point 6 on the same layer. Another via 2612 connects point 6 to point 7 on the bottom layer 2626 (red trace) where the coil winding 2628 continues to point 8 on the same layer. Points 5-8 form another turn of the coil winding 2628. From point 8, the coil winding 2628 proceeds to point 9 on the top layer 2620 (green trace) through yet another one of the vias 2612 and continues to point 10 on the same layer. Another via 2612 connects point 10 to point 11 on the bottom layer 2626 (red trace) where the coil winding 2628 continues to point 12 on the same layer. Points 9-12 form the final turn in the coil winding 2628 in this example. Another multi-layer coil winding may begin at point 1' and continue in a similar manner as described above.

Figure 27:
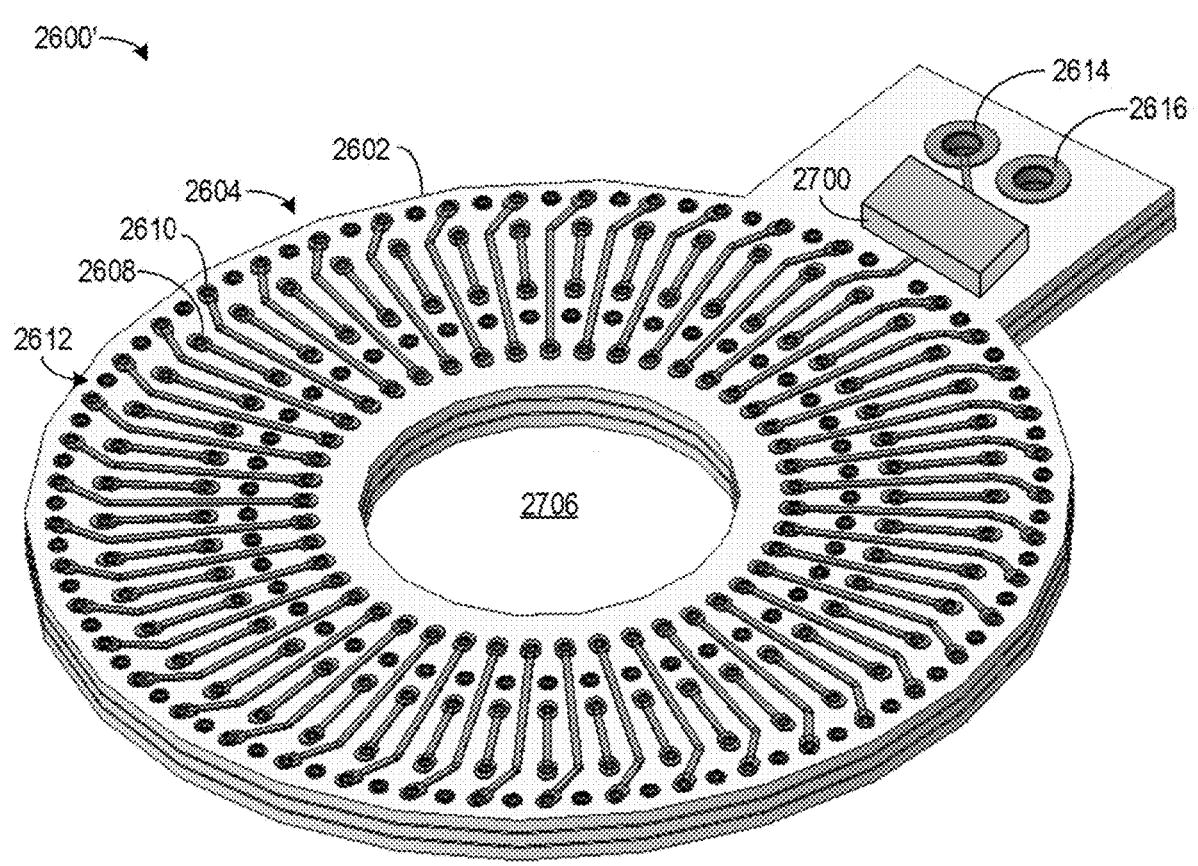
FIG. 27 shows a perspective view illustrating a PCB trace current sensor with onboard signal conditioning according to embodiments of the present disclosure.

FIG. 27 is a perspective view showing an alternative PCB trace current sensor 1900' according to embodiments of the present disclosure. The PCB trace current sensor 2600' shown here is otherwise similar to the PCB trace current sensor 2600 from FIG. 26, except that a signal conditioning circuit (also referred to as "signal conditioner") 2700 is provided on the PCB substrate 2602 for convenient signal conditioning and processing. The voltages produced by the PCB trace current sensor 2600' may then be conditioned prior to being provided as an output signal by the lead terminals 2614, 2616. In various embodiments, the output of the signal conditioning circuit may be connected for output through I/O ports of the PCB substrate using embedded connectors to reduce crosstalk or crosstalk error.

Figure 28:
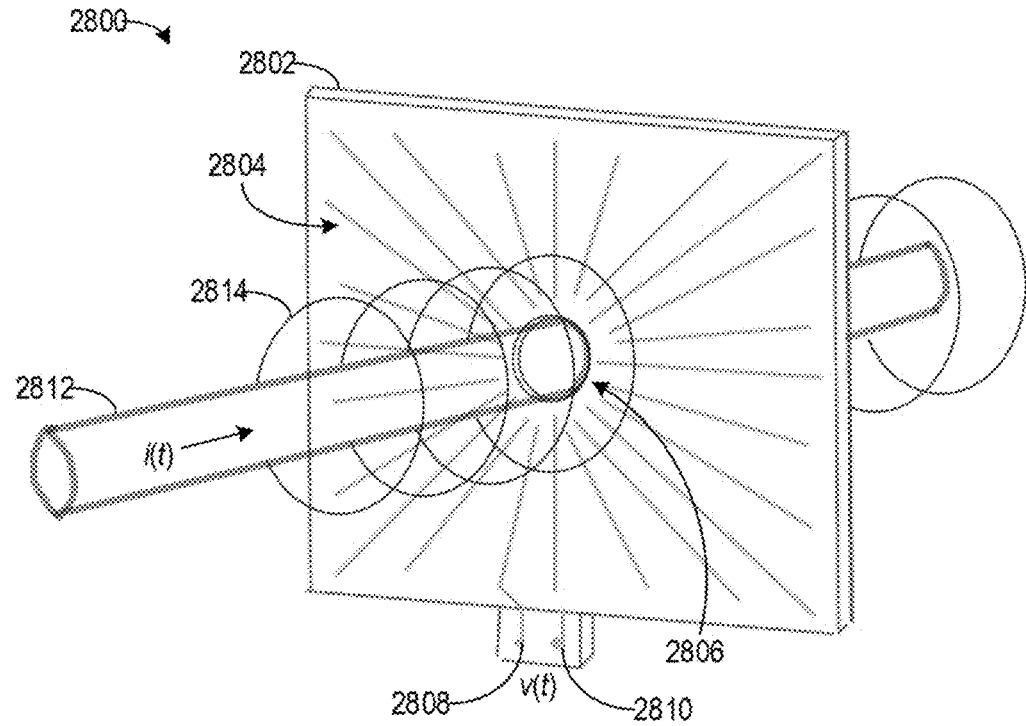
FIG. 28 shows a conceptual diagram illustrating operation of another exemplary PCB trace current sensor according to embodiments of the present disclosure.

FIG. 28 is a conceptual diagram showing another PCB trace current sensor 2800 in operation, this one having a generally rectangular contour according to some embodiments. As can be seen, the PCB trace current sensor 2800 is otherwise similar to its circular counterpart in FIG. 23 except for a PCB substrate 2802 having a square contour. Like its counterpart in FIG. 23, the PCB substrate 2802 has a plurality of elongate conductive traces 2804 formed therein and extending generally radially outward from a central opening or hole 2806 in the PCB substrate 2802. The elongate conductive traces 2804 are again connected to one another by vias to form a conductive helix encircling the central opening 2806 in the PCB substrate 2802 that behaves like a Rogowski coil electrically. Lead terminals 2808, 2810 for the Rogowski coil may again be formed by omitting any given via and connecting circuit leads to the open-ended traces.

In general operation, as understood in the art, an alternating current i(t) flowing in a conductor 2812 running through the opening 2806 in the PCB trace current sensor 2800 induces an alternating electromagnetic field around the conductor 2812, indicated by field lines 2814. The alternating electromagnetic field 2814 in turn induces an alternating voltage v(t) in the conductive traces 2804 that is proportional to the current i(t) in the conductor 2812. The alternating voltage v(t) can then be sampled and measured at the terminals 2808, 2810 to monitor the current flowing through the conductor 2812.

Figure 29:
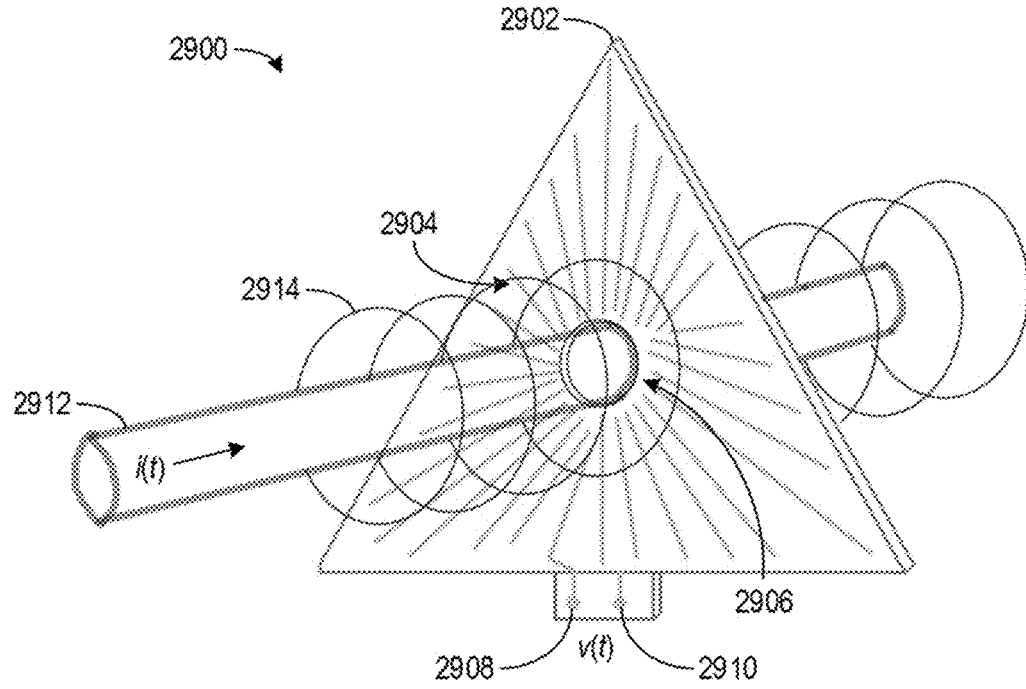
FIG. 29 shows a conceptual diagram illustrating operation of yet another exemplary PCB trace current sensor according to embodiments of the present disclosure.

FIG. 29 is a conceptual diagram showing yet another PCB trace current sensor 2900 in operation, this one having a generally triangular contour according to some embodiments. The PCB trace current sensor 2900 here is again similar to its circular counterpart in FIG. 23 except for a PCB substrate 2902 having a triangular contour. Like its counterpart in FIG. 23, the PCB substrate 2902 has a plurality of elongate conductive traces 2904 formed therein and extending generally radially outward from a central opening or hole 2906 in the PCB substrate 2902. The elongate conductive traces 2904 are once again connected to one another by vias to form a conductive helix encircling the central opening 2906 in the PCB substrate 2902 that electrically resembles a Rogowski coil. Lead terminals 2908, 2910 for the Rogowski coil may once again be formed by omitting any given via and connecting circuit leads to the open-ended traces for that via.

In general operation, an alternating current i(t) flowing in a conductor 2912 running through the opening 2906 in the PCB trace current sensor 2900 induces an alternating electromagnetic field around the conductor 2912, indicated by field lines 2914. The alternating electromagnetic field 2914 again induces an alternating voltage v(t) in the conductive traces 2904 that is proportional to the current i(t) in the conductor 2912. The alternating voltage v(t) can then be sampled and measured at the terminals 2908, 2910 to monitor the current flowing through the conductor 2912.

Figure 30:
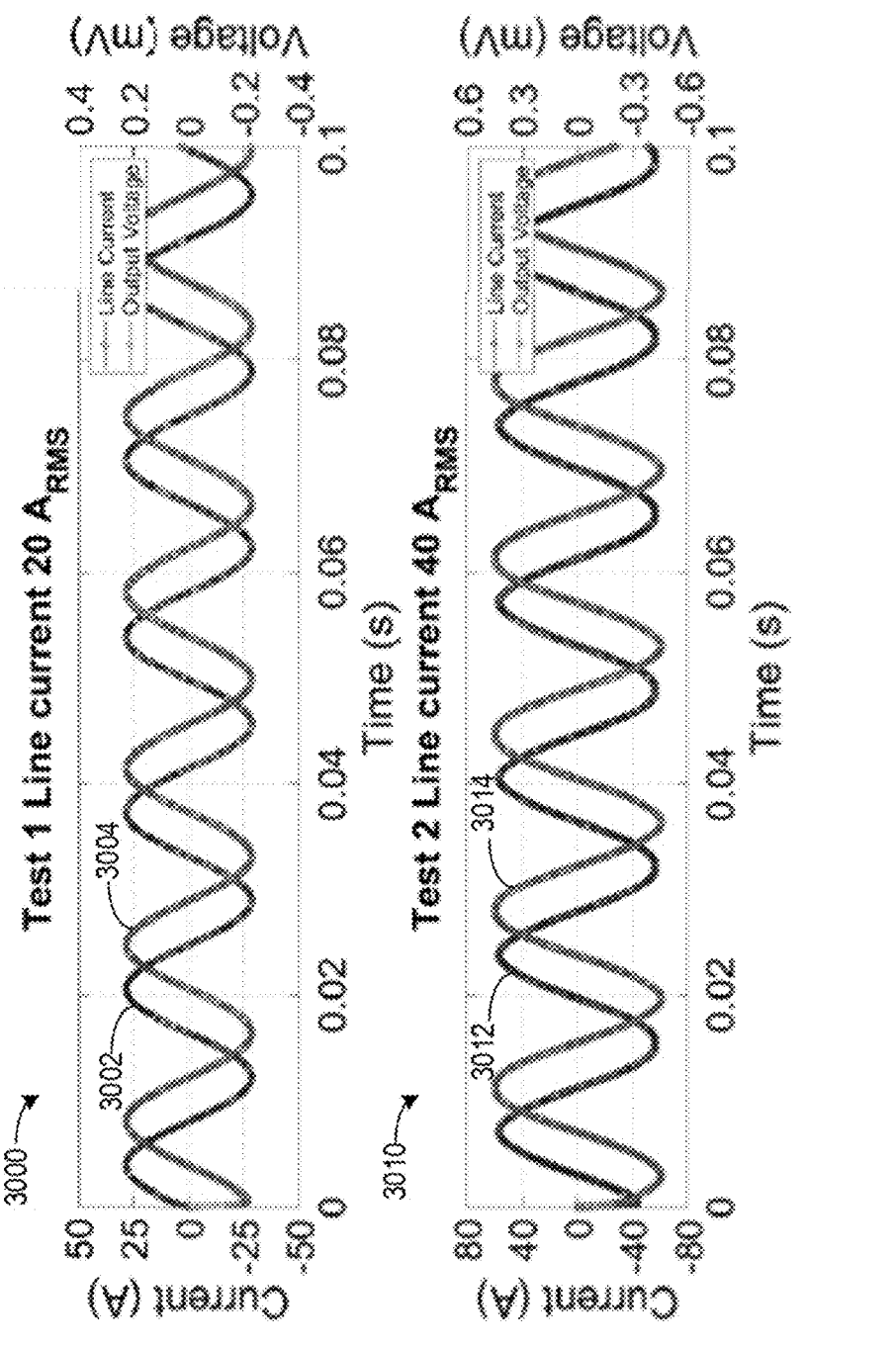
FIG. 30 shows graphs illustrating exemplary performance of a PCB trace current sensor according to embodiments of the present disclosure.

Referring now to FIG. 30, graphs are shown illustrating performance under test conditions for a PCB trace current sensor according to embodiments of the present disclosure. In both graphs, the left vertical axis represents test current, the right vertical axis represents current sensor voltage, and the horizontal axis represents time. The first graph, indicated at 3000, shows the results of testing using a line current of 20 Amps RMS. Current waveform 3002 represents the line current and voltage waveform 3004 represents the voltage signal produce by the PCB trace current sensor (and conditioned by a signal processing front end) in response to the line current. As can be seen, the voltage waveform 3004 closely tracks the current waveform 3002, indicating that the PCB trace current sensor was able to accurately sense the line current. The second graph, indicated at 3010, shows the results of testing using a line current of 40 Amps RMS. Current waveform 3012 represents the line current and voltage waveform 3014 represents the voltage signal produce by the PCB trace current sensor in response to the line current. Again, it can be seen that the voltage waveform 3014 closely tracks the current waveform 3012, indicating that the PCB trace current sensor was able to accurately sense the line current.

It should also be understood that the example embodiments disclosed and taught herein are susceptible to numerous and various modifications and alternative forms. Thus, the use of a singular term, such as, but not limited to, "a" and the like, is not intended as limiting of the number of items. Furthermore, the naming conventions for the various components, functions, characteristics, thresholds, and other elements used herein are provided as examples, and can be given a different name or label. The use of the term "or" is not limited to exclusive "or", but can also mean "and/or".

A processor(s), controller(s) or processing unit(s) as described herein can be a processing system, which can include one or more processors, such as CPU, controller, ASIC, or other processing unit or circuitry, which controls or performs the operations of the devices or systems, described herein. Memory/storage devices can include, but are not limited to, disks, solid state drives, optical disks, removable memory devices such as smart cards, SIMs, WIMs, semiconductor memories such as RAM, ROM, PROMS, etc. Transmitting mediums or networks include, but are not limited to, transmission via wireline communication, wireless communication (e.g., Radio Frequency (RF) communication, Bluetooth®, Wi-Fi, Li-Fi, etc.), the Internet, intranets, telephone/modem-based network communication, hard-wired/cabled communication network, satellite communication, and other stationary or mobile network systems/communication links.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention as defined in the appended claims.

While several embodiments of the present disclosure have been shown and described herein, it is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. An energy monitoring system comprising:
a trace current sensor configured to monitor an electrical conductor and on a first printed circuit board (PCB) substrate around an opening of the first PCB substrate, the opening configured to receive a portion of the electrical conductor; and
a signal conditioner configured to condition an output signal from the trace current sensor, the output signal corresponding to a measurement of current on the electrical conductor, the signal conditioner being on the first PCB substrate or a second PCB substrate that is separate from the first PCB substrate,
wherein the trace current sensor comprises a plurality of electrically conductive elongate traces extending radially outward from the first opening.

2. The energy monitoring system according to claim 1, wherein the signal conditioner is on the first PCB substrate.

3. The energy monitoring system according to claim 2, further comprising:
a processor, on the first PCB substrate, configured to measure energy usage of one or more loads connected to the conductor based on the measurement of current.

4. A flow monitoring device comprising:
the energy monitoring system of claim 3; and
a device processor configured to:
receive from the energy monitoring system real-time measurement of energy usage of one or more loads connected to the conductor, and
manage energy usage through the conductor based on the measurement of energy usage.

5. The energy monitoring system according to claim 2, wherein the opening comprises a plurality of sensor openings each configured to receive an electrical conductor to be monitored, each of the sensor openings having associated therewith a current sensor of the trace current sensor and a conditioner of the signal conditioner on the first PCB substrate.

6. The energy monitoring system according to claim 5, wherein the trace current sensor comprises:
the plurality of electrically conductive elongate traces arranged in pairs of traces, the extending radially out traces in each pair of traces being formed on opposite sides of the first PCB substrate;
a plurality of vertical interconnect access (vias) on the first PCB substrate, the vias connecting the traces together so as to form a conductive helix in a shape of a circle or a polygon that surrounds the opening in the first PCB substrate; and
lead terminals on the first PCB substrate, the lead terminals being formed by omitting a via for a given pair of traces and terminating the traces for the given pair of traces.

7. The energy monitoring system according to claim 5, wherein each of the sensor openings comprises a through-hole within a border of a body of the PCB substrate.

8. The energy monitoring system according to claim 5, wherein the signal conditioner comprises at least a signal integrator.

9. The energy monitoring system according to claim 5, wherein each current sensor is connected to a respective conditioner via an embedded conductor on the first PCB substrate.

10. The energy monitoring system according to claim 5, further comprising a non-sensor opening configured to allow an electrical conductor to pass through the first PCB substrate.

11. The energy monitoring system according to claim 10, wherein the plurality of sensor openings comprises two sensor openings for monitoring first and second power line conductors, and the non-sensor opening is configured to receive a neutral conductor.

12. The energy monitoring system according to claim 2, wherein the output signal from the trace current sensor comprises a voltage signal corresponding to a measurement of current on the conductor.

13. The energy monitoring system according to claim 1, wherein the signal conditioner is on the second PCB substrate, and the first PCB substrate and the second PCB substrate or components thereof are connected across a flexible connector.

14. The energy monitoring system according to claim 13, wherein the flexible connector is a flat flexible connector or FFC.

15. The energy monitoring system according to claim 13, further comprising:
a processor, on the second PCB substrate, configured to measure energy usage of one or more loads connected to the conductor based on the measurement of current.

16. The energy monitoring system according to claim 15, wherein the processor is further configured to perform arc fault detection based on the measurement of current.

17. The energy monitoring system according to claim 16, wherein the signal conditioner comprises a signal integrator.

18. A flow monitoring device comprising:
a device processor; and
the energy monitoring system of claim 1,
wherein the flow monitoring device comprises one of a miniature circuit breaker (MCB), a metering device, an energy metering device, a wiring device, an arc fault circuit interrupt (AFCI) device, ground fault interrupt (GFI) receptacle wiring device, or a GFI smart plug.

19. An energy monitoring system comprising:
a trace current sensor configured to monitor an electrical conductor and on a first printed circuit board (PCB) substrate around an opening of the first PCB substrate, the opening configured to receive a portion of the electrical conductor; and
a signal conditioner configured to condition an output signal from the trace current sensor, the output signal corresponding to a measurement of current on the electrical conductor, the signal conditioner being on the first PCB substrate or a second PCB substrate that is separate from the first PCB substrate,
wherein the signal conditioner is on the first PCB substrate,
wherein the opening comprises a plurality of sensor openings each configured to receive an electrical conductor to be monitored, each of the sensor openings having associated therewith a current sensor of the trace current sensor and a conditioner of the signal conditioner on the first PCB substrate, and wherein each of the sensor openings comprises a notch on a side of the first PCB substrate.

20. A flow monitoring device comprising:

an energy monitoring system comprising:

a trace current sensor configured to monitor an electrical conductor and on a first printed circuit board (PCB) substrate around an opening of the first PCB substrate, the opening configured to receive a portion of the electrical conductor, a signal conditioner configured to condition an output signal from the trace current sensor, the output signal corresponding to a measurement of current on the electrical conductor, the signal conditioner being on the first PCB substrate or a second PCB substrate that is separate from the first PCB substrate, and a processor, on the first PCB substrate, configured to measure energy usage of one or more loads connected to the conductor based on the measurement of current, wherein the signal conditioner is on the first PCB substrate; and a device processor configured to:

receive from the energy monitoring system real-time measurement of energy usage of one or more loads connected to the conductor, and manage energy usage through the conductor based on the measurement of energy usage, wherein the flow monitoring device comprises a multi-pole miniature circuit breaker having N-poles associated with N line conductors where N is a positive integer greater than 1, the flow monitoring device comprising:

N energy monitoring systems each of which monitors a respective conductor of the N line conductors, each energy monitoring system having a single trace current sensor.

\* \* \* \* \*